(12) United States Patent
Chiu

(10) Patent No.: US 11,676,857 B2
(45) Date of Patent: Jun. 13, 2023

(54) METHOD FOR PREPARING SEMICONDUCTOR STRUCTURE HAVING VOID BETWEEN BONDED WAFERS

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 108 days.

(21) Appl. No.: 17/511,211

(22) Filed: Oct. 26, 2021

(65) Prior Publication Data

US 2022/0044963 A1  Feb. 10, 2022

Related U.S. Application Data

(62) Division of application No. 16/857,920, filed on Apr. 24, 2020, now abandoned.

(51) Int. Cl.
*H01L 21/768* (2006.01)
*H01L 21/8238* (2006.01)
*H01L 21/321* (2006.01)

(52) U.S. Cl.
CPC .. *H01L 21/76829* (2013.01); *H01L 21/32115* (2013.01); *H01L 21/76814* (2013.01); *H01L 21/823821* (2013.01)

(58) Field of Classification Search
CPC ......... H01L 21/76829; H01L 21/32115; H01L 21/76814; H01L 2224/94; H01L 21/76898; H01L 24/07; H01L 25/50; H01L 2225/06527; H01L 25/0657; H01L 23/5226; H01L 21/76877; H01L 23/481; H01L 23/5283

See application file for complete search history.

(56) References Cited

U.S. PATENT DOCUMENTS

2015/0235949 A1  8/2015  Yu et al.
2019/0385935 A1  12/2019  Gao et al.
2019/0385966 A1*  12/2019  Gao .................. H01L 25/50

\* cited by examiner

*Primary Examiner* — Thanhha S Pham
(74) *Attorney, Agent, or Firm* — Xuan Zhang

(57) ABSTRACT

A method includes providing a first wafer including a first substrate, a first dielectric layer disposed over the first substrate and a first component formed within the first dielectric layer; providing a second wafer including a second substrate, a second dielectric layer disposed over the second substrate, and a second component formed within the second dielectric layer; removing a first portion of the first dielectric layer to form a first recess; removing a second portion of the second dielectric layer to form a second recess; disposing the second wafer over the first wafer to bond the first dielectric layer to the second dielectric layer; removing a third portion of the second substrate and the second dielectric layer to form a third recess coupled to the second recess; and disposing a conductive material to fill the first recess, the second recess and the third recess to form a conductive structure.

12 Claims, 27 Drawing Sheets

METHOD FOR PREPARING SEMICONDUCTOR STRUCTURE HAVING VOID BETWEEN BONDED WAFERS

CROSS-REFERENCE TO RELATED APPLICATION

This application is a divisional application of U.S. Non-Provisional application Ser. No. 16/857,920 filed Apr. 24, 2020, which is incorporated herein by reference in its entirety.

TECHNICAL FIELD

The present disclosure relates to a method of manufacturing a semiconductor structure. Particularly, the present disclosure relates to a method of manufacturing a semiconductor structure having a through via electrically connected to components in two semiconductive wafers or circuitries or components external to the wafers.

DISCUSSION OF THE BACKGROUND

Semiconductor devices are used in a variety of electronic applications, such as personal computers, cellular phones, digital cameras, and other electronic equipment. The fabrication of semiconductor devices involves sequentially depositing various material layers over a semiconductive wafer, and patterning the material layers using lithography and etching processes to form microelectronic components, including transistors, diodes, resistors and/or capacitors, on or in the semiconductive wafer.

The semiconductor industry continues to improve the integration density of the microelectronic components by continual reduction of minimum feature size, which allows more components to be integrated into a given area. Smaller package structures with smaller footprints are developed to package the semiconductor devices. For example, in an attempt to further increase density of the semiconductor device, three-dimensional (3D) integrated circuits including stacks of two or more microelectronic components have been investigated.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a first wafer including a first dielectric layer and a first component disposed within the first dielectric layer; a second wafer disposed over the first wafer and including a second dielectric layer over the first dielectric layer, and a second component disposed within the second dielectric layer; and a conductive structure including a first member surrounded by the first dielectric layer and the second dielectric layer, and a second member protruding from the first member and surrounded by the second wafer.

In some embodiments, the first dielectric layer is in contact with the second dielectric layer.

In some embodiments, the first component, the second component and the conductive structure are electrically connected to each other.

In some embodiments, the first component and the second component at least partially contact the first member of the conductive structure.

In some embodiments, a thickness of the first wafer is substantially greater than a thickness of the second wafer.

In some embodiments, the first dielectric layer and the second dielectric layer include oxide.

In some embodiments, the semiconductor structure further includes an isolating layer surrounding at least a portion of the second member of the conductive structure and disposed between the second dielectric layer and the second member of the conductive structure.

In some embodiments, the isolating layer includes oxide.

Another aspect of the present disclosure provides a method of manufacturing a semiconductor structure. The method includes steps of providing a first wafer including a first substrate, a first dielectric layer disposed over the first substrate and a first component formed within the first dielectric layer; providing a second wafer including a second substrate, a second dielectric layer disposed over the second substrate, and a second component formed within the second dielectric layer; removing a first portion of the first dielectric layer to form a first recess; removing a second portion of the second dielectric layer to form a second recess; disposing the second wafer over the first wafer to bond the first dielectric layer to the second dielectric layer; removing a third portion of the second substrate and the second dielectric layer to form a third recess coupled to the second recess; and disposing a conductive material to fill the first recess, the second recess and the third recess to form a conductive structure.

In some embodiments, the removal of the first portion of the first dielectric layer includes exposing a portion of the first component through the first dielectric layer.

In some embodiments, the removal of the second portion of the second dielectric layer includes exposing a portion of the second component through the second dielectric layer.

In some embodiments, the first recess is aligned with the second recess.

In some embodiments, a void defined by the first recess and the second recess is formed after the disposing of the second wafer over the first wafer.

In some embodiments, the removal of the third portion of the second substrate and the second dielectric layer includes removing a first section of the third portion to form a first opening, disposing an isolating layer conformal to the first opening, removing a bottom portion of the isolating layer, and removing a second section of the third portion to form a second opening.

In some embodiments, the conductive material is disposed by electroplating.

In some embodiments, the third portion of the second substrate and the second dielectric layer is removed by dry etching or laser drilling.

In some embodiments, the disposing of the second wafer over the first wafer includes forming a first interface between the first dielectric layer and the second dielectric layer.

In some embodiments, a second interface between the conductive structure and the first dielectric layer or a third interface between the conductive structure and the second dielectric layer is formed after the disposing of the conductive material.

In some embodiments, the method further includes grinding the second substrate to reduce a thickness of the second wafer prior to the removal of the third portion of the second substrate and the second dielectric layer.

In some embodiments, the first recess and the second recess are filled with the conductive material after the first dielectric layer is bonded to the second dielectric layer.

In conclusion, a semiconductor structure including a void between two wafers and a conductive structure within the void is formed. Since the conductive structure is formed after bonding of two wafers, alignment between two wafers would not adversely affect reliability of the conductive structure interconnecting two wafers. Therefore, overall performance of the semiconductor structure having the conductive structure formed after the bonding of two wafers can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
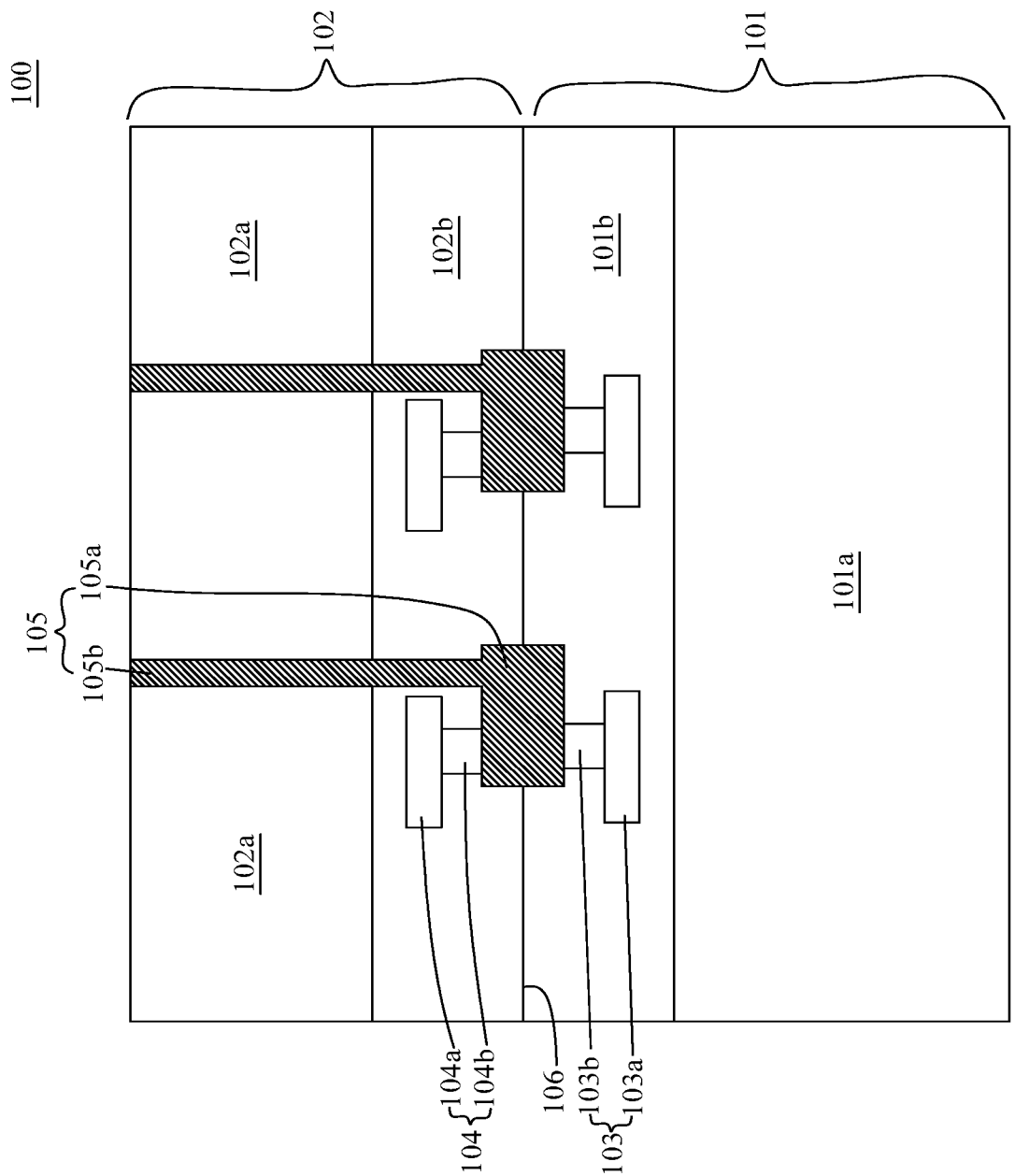
FIG. 1 is a cross-sectional view of a first semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a first semiconductor structure 100 in accordance with some embodiments of the present disclosure. In some embodiments, the first semiconductor structure 100 is a part of a die, a package or a device. In some embodiments, the first semiconductor structure 100 includes a first wafer 101 and a second wafer 102 stacked over the first wafer 101. In some embodiments, the first wafer 101 is bonded to the second wafer 102. In some embodiments, the second wafer 102 is stacked over the first wafer 101 in front-to-front configuration. In some embodiments, the first wafer 101 is a bottom wafer, and the second wafer 102 is a top wafer. In some embodiments, a thickness of the first wafer 101 is substantially greater than a thickness of the second wafer 102.

In some embodiments, the first wafer 101 includes a first substrate 101a and a first dielectric layer 101b disposed over the first substrate 101a. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon layer. In some embodiments, a thickness of the first substrate 101a is between about 500 μm and about 800 μm.

In some embodiments, several circuitries or electrical components such as transistors, capacitors, resistors, diodes, photodiodes or the like are disposed over the first substrate 101a. In some embodiments, electrical circuitries formed on the first substrate 101a can be any type of circuitry suitable for a particular application. In some embodiments, the electrical circuitries may include various n-type metal-oxide semiconductor (NMOS) and/or p-type metal-oxide semiconductor (PMOS) devices such as transistors, capacitors, resistors, diodes, photodiodes, fuses or the like. The electrical circuitries may be connected to perform one or more functions. The functions may include memory, processing, sensing, amplification, power distribution, input/output, or the like. One of ordinary skill in the art will appreciate that the above examples are provided for illustrative purposes only and are not intended to limit the various embodiments to any particular application.

In some embodiments, the first dielectric layer 101b is disposed on the first substrate 101a. In some embodiments, the first dielectric layer 101b includes dielectric material such as oxide, nitride, silicon dioxide, silicon nitride, silicon oxynitride, silicon carbide, polymer or the like. In some embodiments, the first dielectric layer 101b includes several dielectric layers stacked over one another. In some embodiments, the first dielectric layer 101b is an interlayer dielectric (ILD) layer. In some embodiments, a thickness of the first dielectric layer 101b is substantially less than 5 µm. In some embodiments, the thickness of the first dielectric layer 101b is between about 2 µm and about 3 µm.

In some embodiments, a first component 103 is included in the first wafer 101a. In some embodiments, the first component 103 is disposed over the first substrate 101a. In some embodiments, the first component 103 is disposed within the first dielectric layer 101b. In some embodiments, the first component 103 can be an electrical component or device such as a transistor, capacitor, resistor, diode, photodiode or the like. In some embodiments, the first component 103 is electrically connected to the circuitry disposed within or over the first substrate 101a.

In some embodiments, the first component 103 is a conductive feature within the first dielectric layer 101b. In some embodiments, the first component 103 includes conductive material such as copper, aluminum, silver or the like. In some embodiments, the first component 103 includes a first conductive pad 103a and a first conductive via 103b extending from the first conductive pad 103a. In some embodiments, the first conductive pad 103a extends laterally in the first dielectric layer 101b, and the first conductive via 103b extends vertically in the first dielectric layer 101b. In some embodiments, the first conductive pad 103a is in contact with the first conductive via 103b.

In some embodiments, the second wafer 102 is disposed over the first wafer 101. In some embodiments, the second wafer 102 includes a second substrate 102a and a second dielectric layer 102b disposed over the second substrate 102a. In some embodiments, the second substrate 102a is a semiconductive layer. In some embodiments, the second substrate 102a includes semiconductive material such as silicon, germanium, gallium, arsenic, or a combination thereof.

In some embodiments, the second substrate 102a is a silicon layer. In some embodiments, the second substrate 102a has a configuration similar to that of the first substrate 101a. In some embodiments, the second substrate 102a includes a same material as the first substrate 101a. In some embodiments, the thickness of the first substrate 101a is substantially greater than a thickness of the second substrate 102a. In some embodiments, the thickness of the second substrate 102a is substantially less than or equal to 50 µm.

In some embodiments, several circuitries or electrical components such as transistors, capacitors, resistors, diodes, photodiodes or the like are disposed over the second substrate 102a. In some embodiments, electrical circuitries formed on the second substrate 102a can be any type of circuitry suitable for a particular application. In some embodiments, the electrical circuitries may include various n-type metal-oxide semiconductor (NMOS) and/or p-type metal-oxide semiconductor (PMOS) devices such as transistors, capacitors, resistors, diodes, photodiodes, fuses or the like. The electrical circuitries may be connected to perform one or more functions. The functions may include memory, processing, sensing, amplification, power distribution, input/output or the like. One of ordinary skill in the art will appreciate that the above examples are provided for illustrative purposes only and are not intended to limit the various embodiments to any particular applications.

In some embodiments, the second dielectric layer 102b is disposed on the second substrate 102a. In some embodiments, the second dielectric layer 102b includes dielectric material such as oxide, nitride, silicon dioxide, silicon nitride, silicon oxynitride, silicon carbide, polymer or the like. In some embodiments, the second dielectric layer 102b includes several dielectric layers stacked over one another. In some embodiments, the second dielectric layer 102b is an interlayer dielectric (ILD) layer.

In some embodiments, a thickness of the second dielectric layer 102b is substantially less than 5 µm. In some embodiments, the thickness of the second dielectric layer 102b is between about 2 µm and about 3 µm. In some embodiments, the second dielectric layer 102b has a configuration similar to that of the first dielectric layer 101b. In some embodiments, the second dielectric layer 102b includes a same material as the first dielectric layer 101b.

In some embodiments, the second dielectric layer 102b is bonded to the first dielectric layer 101b. In some embodiments, the first dielectric layer 101b is in contact with the second dielectric layer 102b. In some embodiments, the second dielectric layer 102b is bonded to the first dielectric layer 101b by a dielectric-to-dielectric bonding process. In some embodiments, a first interface 106 is present between the first dielectric layer 101b and the second dielectric layer 102b. In some embodiments, the first interface 106 may be absent, such that the first dielectric layer 101b is integral with the second dielectric layer 102b.

In some embodiments, a second component 104 is included in the second wafer 102a. In some embodiments, the second component 104 is disposed over the second substrate 102a. In some embodiments, the second component 104 is disposed within the second dielectric layer 102b. In some embodiments, the second component 104 can be an electrical component or device such as a transistor, capacitor, resistor, diode, photodiodes or the like. In some embodiments, the second component 104 is electrically connected to the circuitry disposed within or over the second substrate 102a. In some embodiments, the second component 104 has a configuration similar to that of the first component 103. In some embodiments, the second component 104 includes a same material as the first component 103.

In some embodiments, the second component 104 is a conductive feature within the second dielectric layer 102b. In some embodiments, the second component 104 includes conductive material such as copper, aluminum, silver or the like. In some embodiments, the second component 104 includes a second conductive pad 104a and a second conductive via 104b extending from the second conductive pad 104a.

In some embodiments, the second conductive pad 104a extends laterally in the second dielectric layer 102b, and the second conductive via 104b extends vertically in the second dielectric layer 102b. In some embodiments, the second conductive pad 104a is in contact with the second conductive via 104b. In some embodiments, the second component 104 is disposed over the first component 103. In some embodiments, the second component 104 is aligned with the first component 103.

In some embodiments, a conductive structure 105 is included in the first semiconductor structure 100. In some embodiments, the conductive structure 105 is disposed within the first wafer 101 and the second wafer 102. In some embodiments, the conductive structure 105 is surrounded by the first dielectric layer 101b, the second dielectric layer 102b and the second substrate 102a.

In some embodiments, the conductive structure 105 is electrically connected to the first component 103 and/or the second component 104. The first component, the second component and the conductive structure are electrically connected to each other. In some embodiments, at least a portion of the conductive structure 105 is disposed between the first component 103 and the second component 104. In some embodiments, the conductive structure 105 includes conductive material such as copper, aluminum, silver or the like.

In some embodiments, the conductive structure 105 includes a first member 105a and a second member 105b protruding from the first member 105a. In some embodiments, the first member 105a is surrounded by the first dielectric layer 101b and the second dielectric layer 102b. In some embodiments, the first member 105a is disposed adjacent to the first interface 106. In some embodiments, the first member 105a is disposed between two sections of the first interface 106. In some embodiments, the first member 105a extends from the first dielectric layer 101b to the second dielectric layer 102b.

In some embodiments, the first component 103 and the second component 104 at least partially contact the first member 105a of the conductive structure 105. In some embodiments, the first member 105a is disposed between the first component 103 and the second component 104. In some embodiments, the first member 105a contacts the first conductive via 103b and the second conductive via 104b.

In some embodiments, the second member 105b is surrounded by the second wafer 102. In some embodiments, an end of the second member 105b is coupled to the first member 105a. In some embodiments, the second member 105b is integral with the first member 105a. In some embodiments, at least a surface of the second member 105b is exposed through an upper surface of the second wafer 102. In some embodiments, a surface of an end of the second member 105b is exposed through an upper surface of the second substrate 102a. In some embodiments, the second member 105b is disposed adjacent to the second component 104. That is, the second member 105b is not disposed over the second component 104.

In some embodiments, the second member 105b extends from the first member 105a toward the second substrate 102a. In some embodiments, the second member 105b extends through the second dielectric layer 102b. In some embodiments, the second member 105b extends away from the first wafer 101. In some embodiments, the second member 105b extends away from the first substrate 101a and the first dielectric layer 101b. In some embodiments, the second member 105b is substantially orthogonal to the first member 105a. In some embodiments, a length of the second member 105b is substantially equal to a total thickness of the second substrate 102a and the second dielectric layer 102b. In some embodiments, the second member 105b is a through substrate via (TSV).

Figure 2:
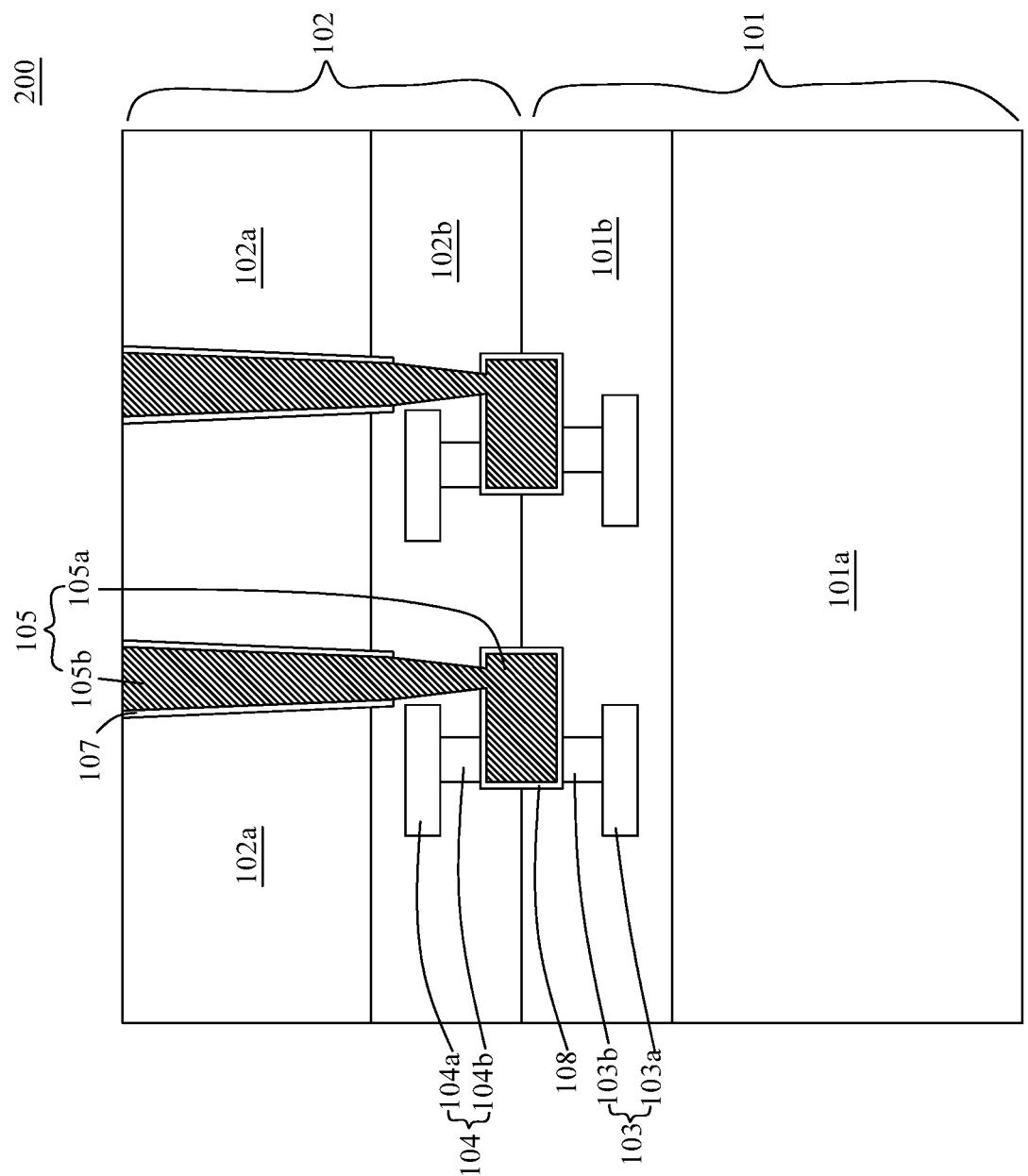
FIG. 2 is a cross-sectional view of a second semiconductor structure in accordance with some embodiments of the present disclosure.

FIG. 2 is a schematic cross-sectional view of a second semiconductor structure 200 in accordance with some embodiments of the present disclosure. In some embodiments, the second semiconductor structure 200 has a configuration similar to that of the first semiconductor structure 100, except the second member 105b has a tapered configuration, and an isolating layer 107 and a first seed layer 108 are included.

In some embodiments, the second member 105b of the conductive structure 105 is tapered from the second substrate 102a toward the second dielectric layer 102b. In some embodiments, a width of a portion of the second member 105b surrounded by the second substrate 102a is substantially greater than a width of a portion of the second member 105b surrounded by the second dielectric layer 102b.

In some embodiments, the isolating layer 107 surrounds at least a portion of the second member 105b of the conductive structure 105 and is disposed between the second dielectric layer 102b and the second member 105b of the conductive structure 105. In some embodiments, the isolating layer 107 is disposed between the second substrate 102a and the second member 105b.

In some embodiments, the isolating layer 107 is absent between the second member 105b and the second dielectric layer 102b. That is, a portion of the second member 105b contacts the second dielectric layer 105b. In some embodiments, the isolating layer 107 isolates the second member 105b from the second substrate 102a. In some embodiments, the isolating layer 107 includes oxide or any other suitable material.

In some embodiments, the first seed layer 108 surrounds the first member 105a of the conductive structure 105. In some embodiments, the first seed layer 108 is disposed between the first member 105a and the first dielectric layer 101b and between the first member 105a and the second dielectric layer 102b. In some embodiments, the first seed layer 108 includes conductive material. In some embodiments, the first seed layer 108 includes two kinds of conductive materials. In some embodiments, the first seed layer 108 includes titanium and copper.

Figure 3:
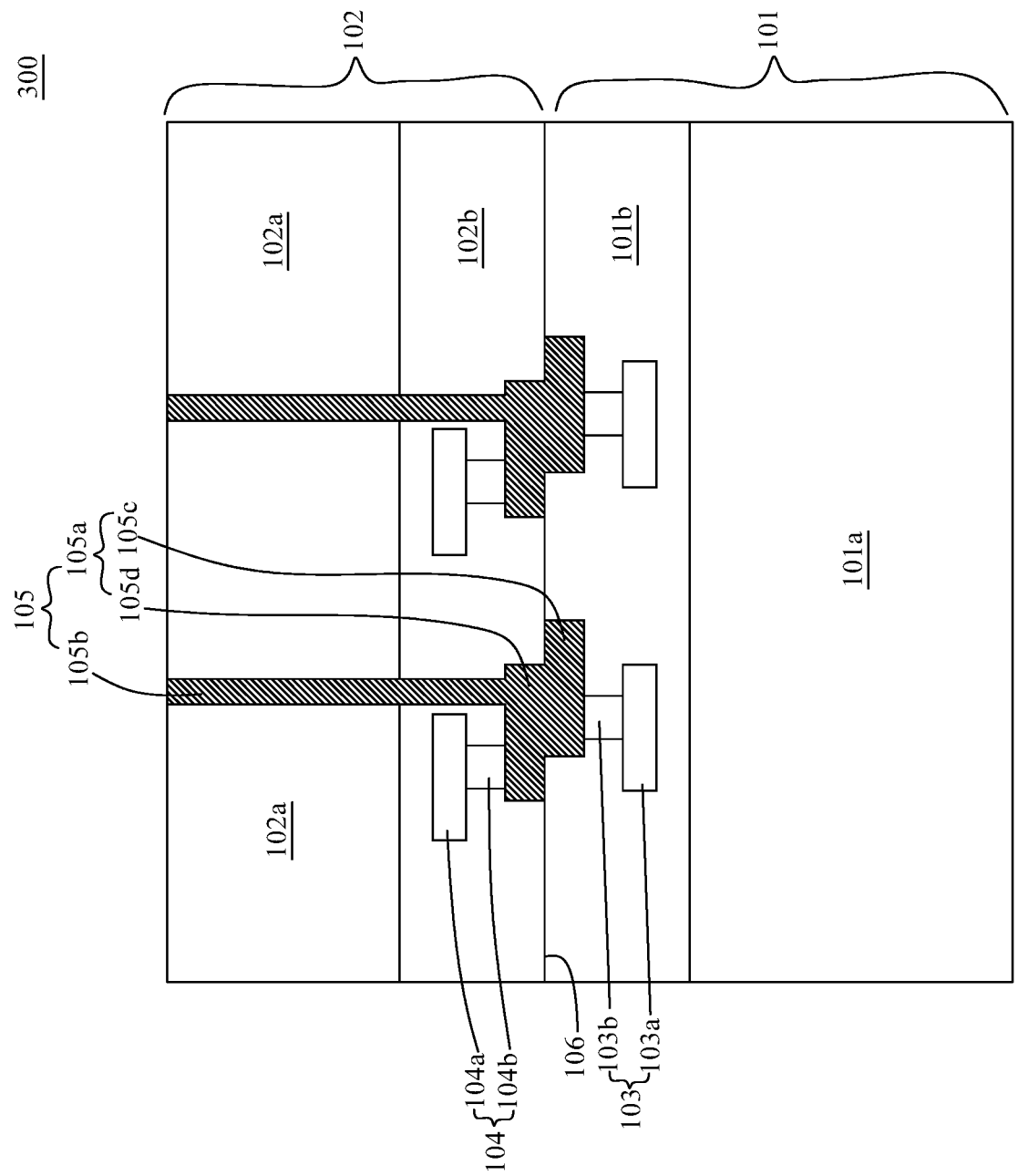
FIG. 3 is a cross-sectional view of a third semiconductor structure in accordance with some embodiments of the present disclosure.

FIG. 3 is a schematic cross-sectional view of a third semiconductor structure 300 in accordance with some embodiments of the present disclosure. In some embodiments, the third semiconductor structure 300 has a configuration similar to that of the first semiconductor structure 100, except that, in the third semiconductor structure 300, the first member 105a includes a first part 105c and a second part 105d offset from the first part 105c.

In some embodiments, the first part 105c and the second part 105d are not aligned with each other. The first part 105c is laterally offset from the second part 105d. In some embodiments, a portion of the first part 105c contacts the second dielectric layer 102b, and a portion of the second part 105d contacts the first dielectric layer 105b. In some embodiments, a portion of the first part 105c is coupled to a portion of the second part 105d.

In some embodiments, the second member 105b protrudes from the second part 105d of the first member 105a. In some embodiments, the first component 103 is coupled to the first part 105c, and the second component 104 is coupled to the second part 105d. In some embodiments, a width of the first part 105c is substantially equal to a width of the second part 105d.

Figure 4:
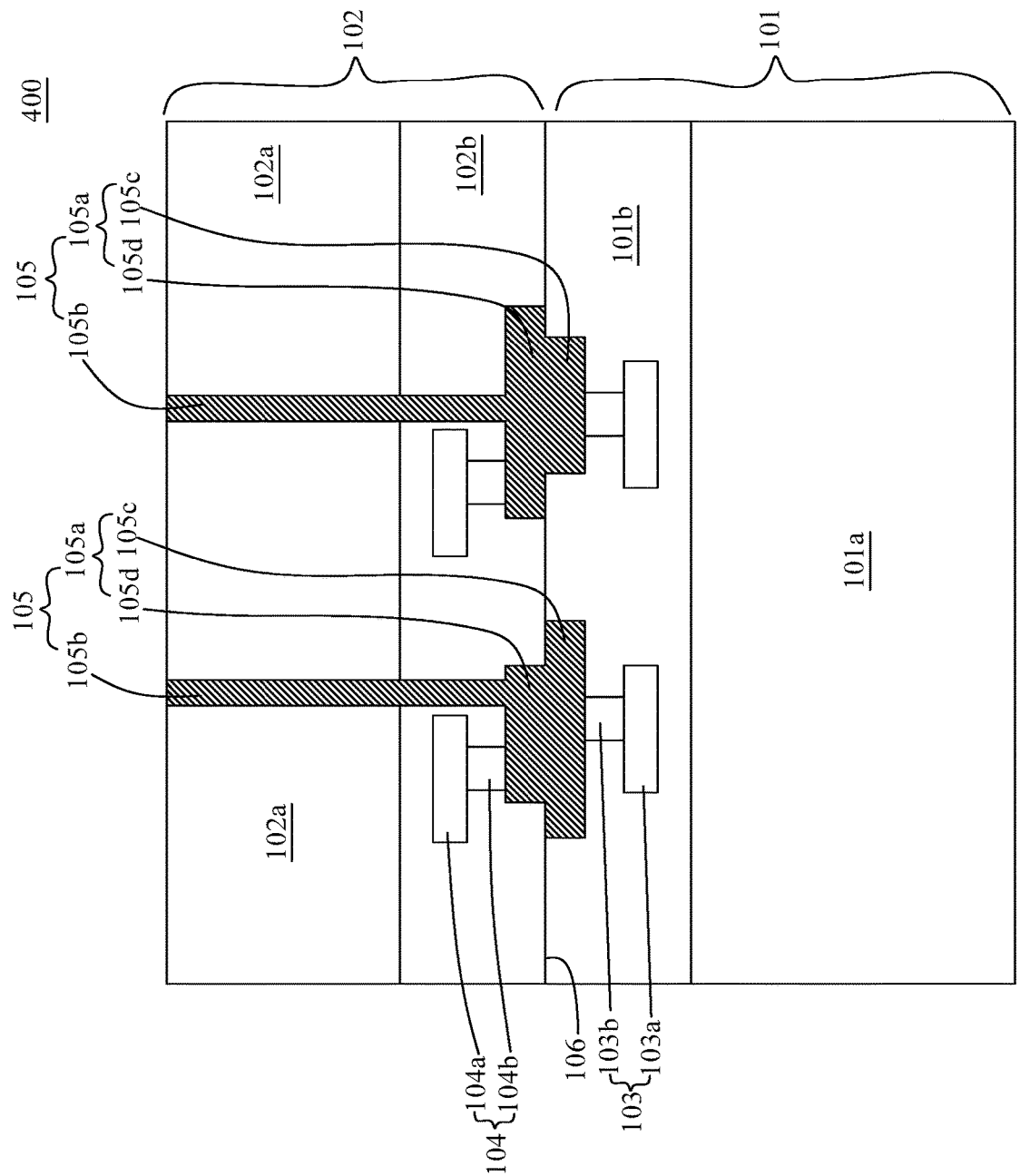
FIG. 4 is a cross-sectional view of a fourth semiconductor structure in accordance with some embodiments of the present disclosure.

FIG. 4 is a schematic cross-sectional view of a fourth semiconductor structure 400 in accordance with some embodiments of the present disclosure. In some embodiments, the fourth semiconductor structure 400 has a configuration similar to that of the first semiconductor structure 100, except that, in the fourth semiconductor structure 400, the first member 105a includes the first part 105c and the second part 105d, wherein a width of the second part 105d is different from a width of the first part 105c.

In some embodiments, the width of the first part 105c is substantially different from the width of the second part 105d. In some embodiments, the width of the first part 105c is substantially greater than or less than the width of the second part 105d. In some embodiments, a portion of the first part 105c contacts the second dielectric layer 102b, and a portion of the second part 105d does not contact the first dielectric layer 105b. In some embodiments, a portion of the first part 105c does not contact the second dielectric layer 102b, and a portion of the second part 105d contacts the first dielectric layer 105b. In some embodiments, a portion of the first part 105c is coupled to a portion of the second part 105d.

Figure 5:
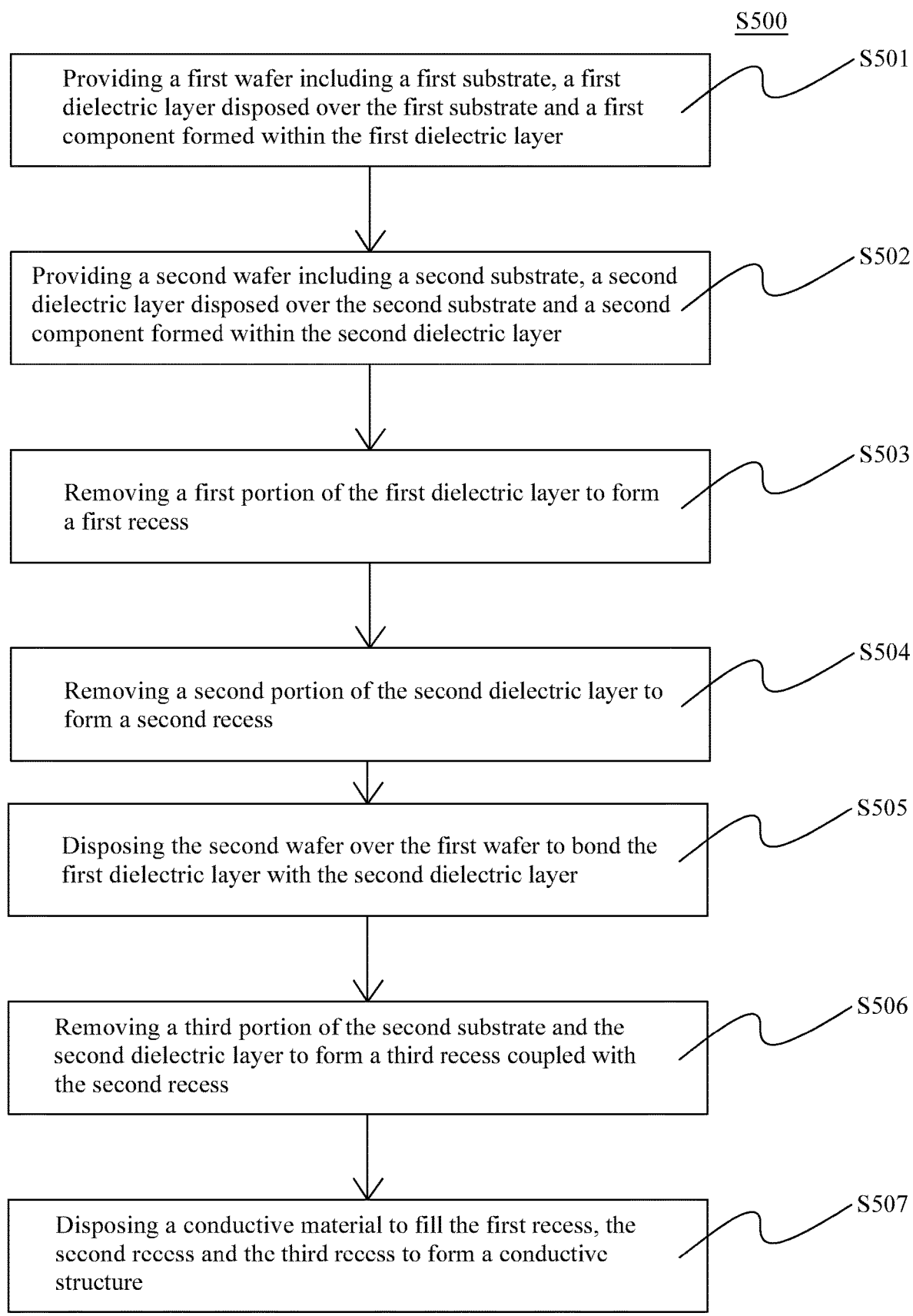
FIG. 5 is a flow diagram illustrating a method of manufacturing a semiconductor structure in accordance with some embodiments of the present disclosure.

FIG. 5 is a flow diagram illustrating a first method S500 of manufacturing a first semiconductor structure 100 in accordance with some embodiments of the present disclosure, and FIGS. 6 through 17 illustrate cross-sectional views of intermediate stages in the formation of the first semiconductor structure 100 in accordance with some embodiments of the present disclosure. The stages shown in FIGS. 6 to 17 are also illustrated schematically in the flow diagram in FIG. 5. In the following discussion, the fabrication stages shown in FIGS. 6 to 17 are discussed in reference to the process steps shown in FIG. 5. The first method S500 includes a number of operations and the description and illustration are not deemed as a limitation as the sequence of the operations. The first method S500 includes a number of steps (S501, S502, S503, S504, S505, S506 and S507).

Figure 6:
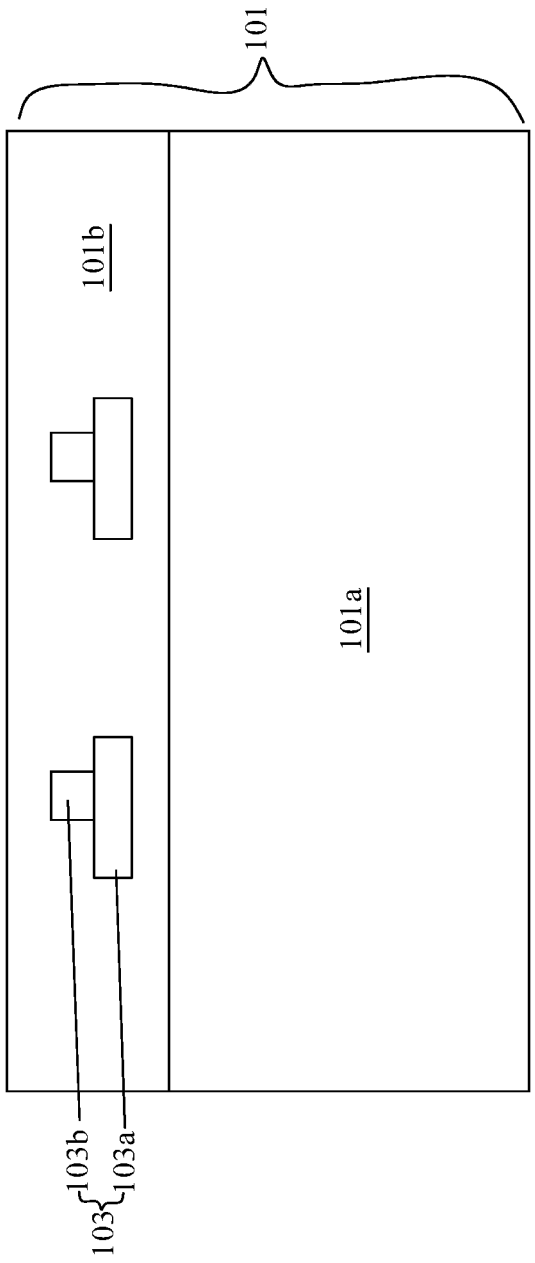
FIGS. 6 through 17 illustrate cross-sectional views of intermediate stages in the formation of a semiconductor structure in accordance with some embodiments of the present disclosure.

Referring to FIG. 6, a first wafer 101, including a first substrate 101a, a first dielectric layer 101b disposed over the first substrate 101a, and a first component 103 formed within the first dielectric layer 101b, is provided according to a step S501 in FIG. 5.

In some embodiments, the first substrate 101a is a semiconductive layer. In some embodiments, the first substrate 101a includes semiconductive material such as silicon, germanium, gallium, arsenic, or combinations thereof. In some embodiments, the first substrate 101a is a silicon layer. In some embodiments, a thickness of the first substrate 101a is between about 500 μm and about 800 μm.

In some embodiments, the first dielectric layer 101b is disposed on the first substrate 101a. In some embodiments, the first dielectric layer 101b is formed by spin coating, plasma-enhanced chemical vapor deposition (PECVD), or any other suitable operation.

In some embodiments, a planarizing process can be optionally performed on the first dielectric layer 101b to yield an acceptably flat topology. In some embodiments, the first dielectric layer 101b includes dielectric material such as oxide, nitride, silicon dioxide, silicon nitride, silicon oxynitride, silicon carbide, polymer or the like. In some embodiments, the first dielectric layer 101b includes several dielectric layers stacked over each other. In some embodiments, the first dielectric layer 101b is an interlayer dielectric (ILD) layer. In some embodiments, a thickness of the first dielectric layer 101b is substantially less than 5 μm.

In some embodiments, the first component 103 is included in the first wafer 101. In some embodiments, the first component 103 is disposed within the first dielectric layer 101b. In some embodiments, the first component 103 can be formed by deposition, etching, implantation, photolithography, annealing or any other suitable operation. In some embodiments, the first component 103 can be an electrical component or device such as a transistor, capacitor, resistor, diode, photodiodes or the like. In some embodiments, the first component 103 is electrically connected to the circuitry disposed within or over the first substrate 101a.

In some embodiments, the first component 103 is a conductive feature within the first dielectric layer 101b. In some embodiments, the first component 103 includes conductive material such as copper, aluminum, silver or the like. In some embodiments, the first component 103 includes a first conductive pad 103a and a first conductive via 103b extending from the first conductive pad 103a. In some embodiments, the first conductive pad 103a is in contact with the first conductive via 103b.

Figure 7:
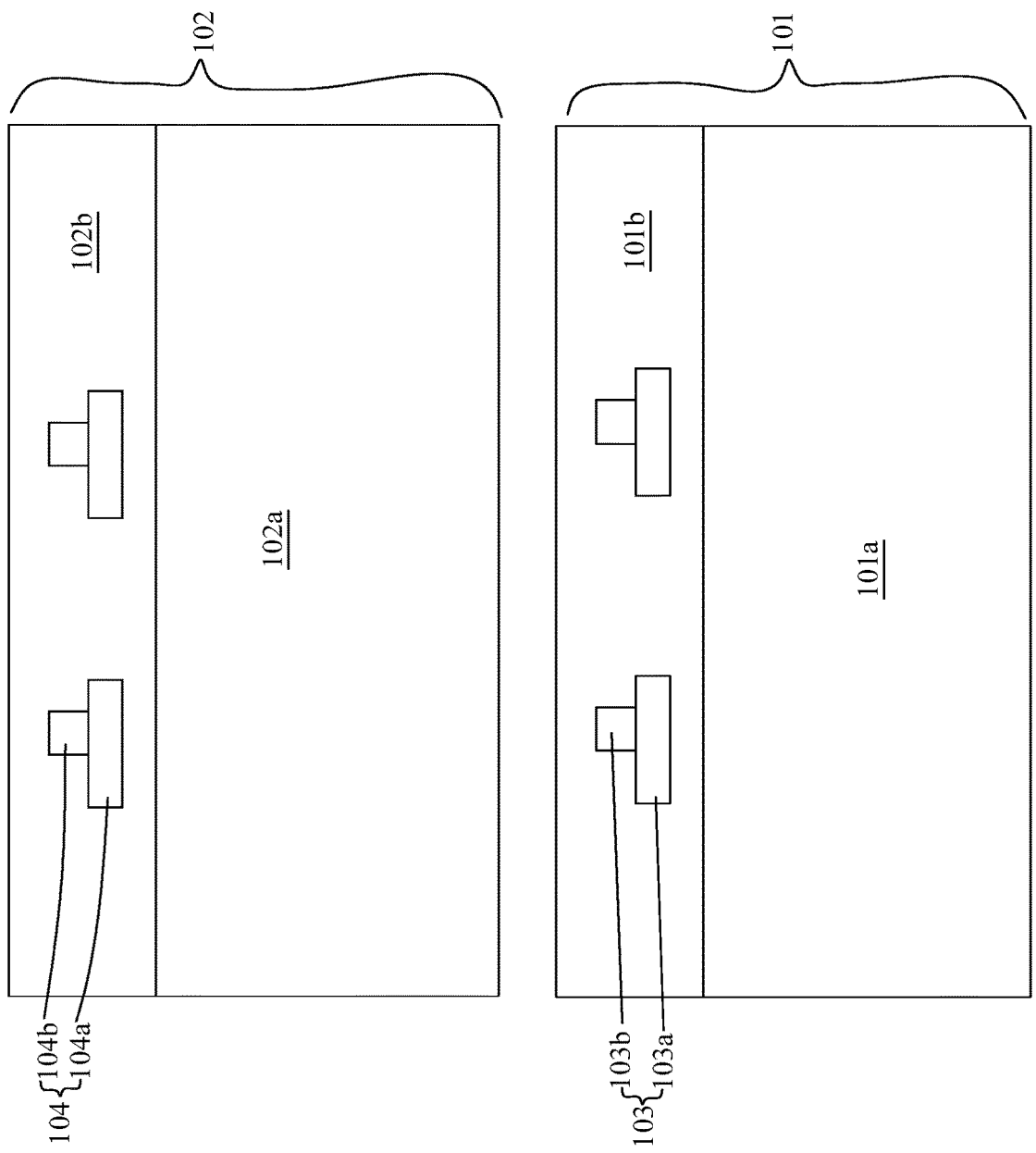

Referring to FIG. 7, a second wafer 102 including a second substrate 102a, a second dielectric layer 102b disposed over the second substrate 102a and a second component 104 formed within the second dielectric layer 102b is provided according to a step S502 in FIG. 5.

In some embodiments, the second substrate 102a is a semiconductive layer. In some embodiments, the second substrate 102a includes semiconductive material such as silicon, germanium, gallium, arsenic, or a combination thereof. In some embodiments, the second substrate 102a is a silicon layer. In some embodiments, the second substrate 102a has a configuration similar to that of the first substrate 101a. In some embodiments, the second substrate 102a includes a same material as the first substrate 101a. In some embodiments, the thickness of the first substrate 101a is substantially equal to a thickness of the second substrate 102a.

In some embodiments, the second dielectric layer 102b is disposed on the second substrate 102a. In some embodiments, the second dielectric layer 102b is formed by spin coating, plasma-enhanced chemical vapor deposition (PECVD) or any other suitable operation. In some embodiments, a planarizing process can be optionally performed on the second dielectric layer 102b to yield an acceptably flat topology.

In some embodiments, the second dielectric layer 102b includes dielectric material such as oxide, nitride, silicon dioxide, silicon nitride, silicon oxynitride, silicon carbide, polymer or the like. In some embodiments, the second dielectric layer 102b includes several dielectric layers stacked over each other. In some embodiments, the second dielectric layer 102b is an interlayer dielectric (ILD) layer. In some embodiments, a thickness of the second dielectric layer 102b is substantially less than 5 μm. In some embodiments, the second dielectric layer 102b has a configuration similar to that of the first dielectric layer 101b. In some embodiments, the second dielectric layer 102b includes a same material as the first dielectric layer 101b.

In some embodiments, the second component 104 is included in the second wafer 102. In some embodiments, the second component 104 is disposed within the second dielectric layer 102b. In some embodiments, the second component 104 can be formed by deposition, etching, implantation, photolithography, annealing or any other suitable operation.

In some embodiments, the second component 104 can be an electrical component or device such as a transistor, capacitor, resistor, diode, photodiodes or the like. In some embodiments, the second component 104 is electrically connected to the circuitry disposed within or over the second substrate 102a. In some embodiments, the second component 104 has a configuration similar to that of the first component 103. In some embodiments, the second component 104 includes a same material as the first component 103.

In some embodiments, the second component 104 is a conductive feature within the second dielectric layer 102b. In some embodiments, the second component 104 includes conductive material such as copper, aluminum, silver or the like. In some embodiments, the second component 104 includes a second conductive pad 104a and a second conductive via 104b extending from the second conductive pad 104a.

Figure 8:
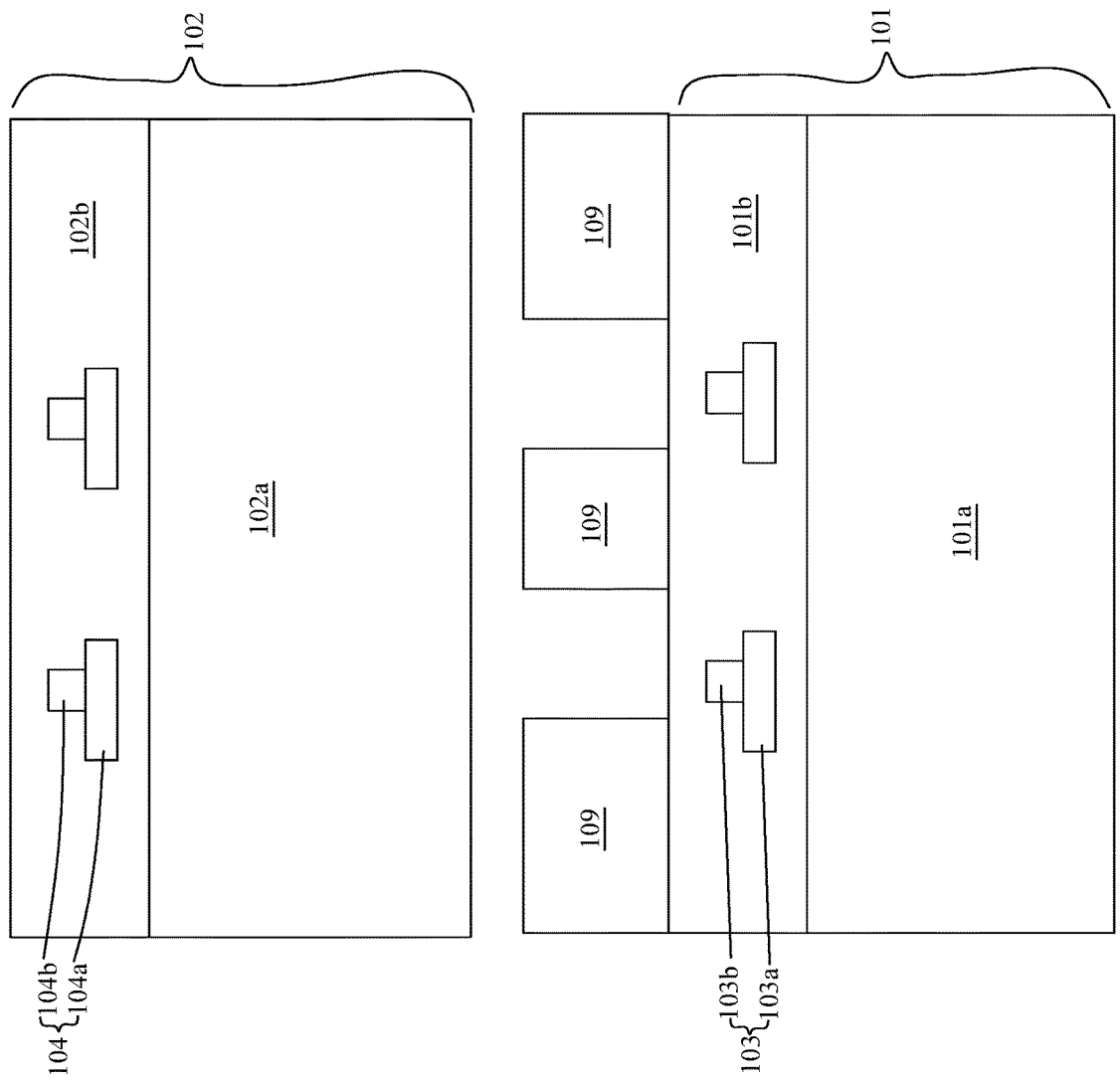
Figure 9:
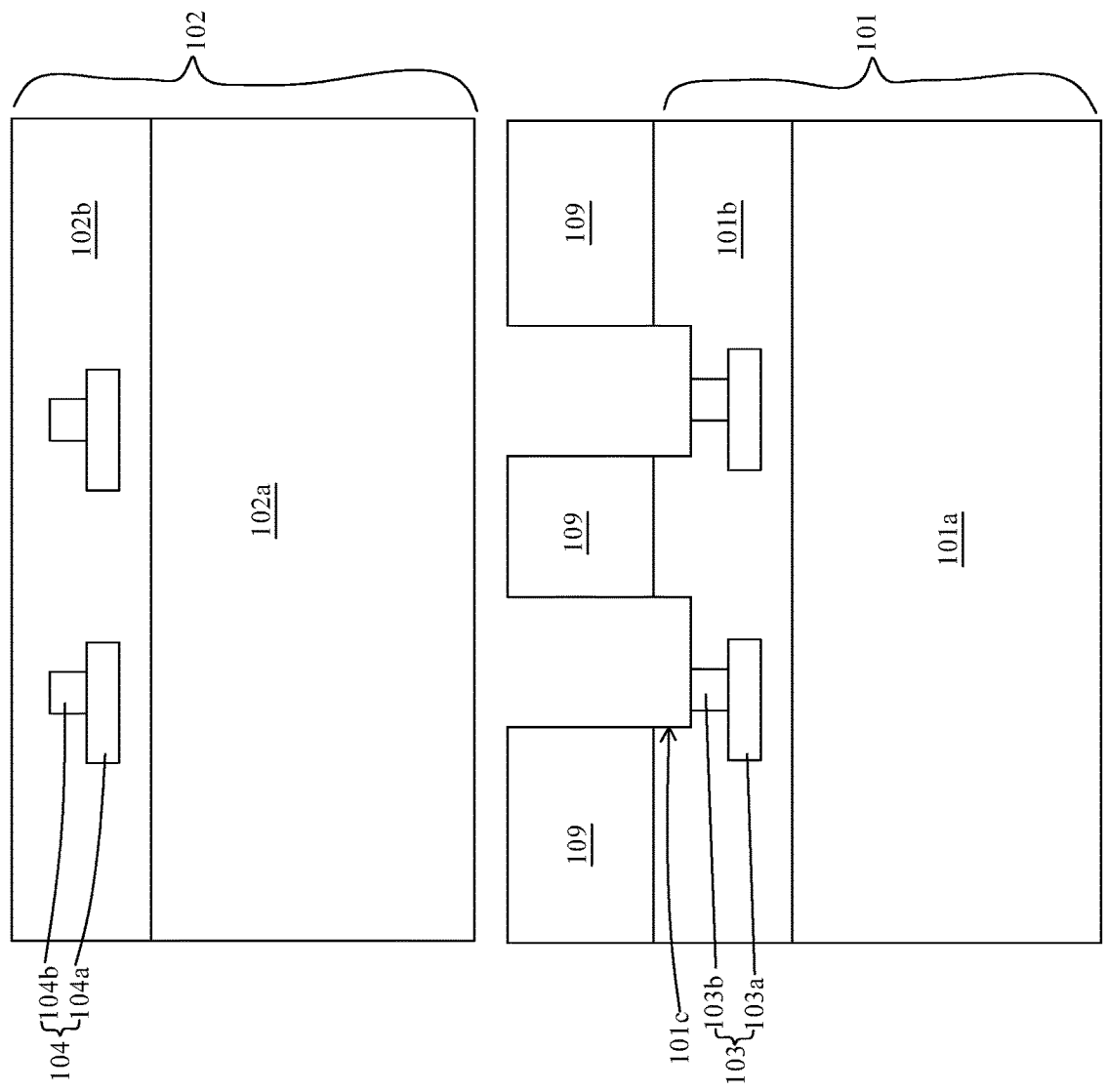
Figure 10:
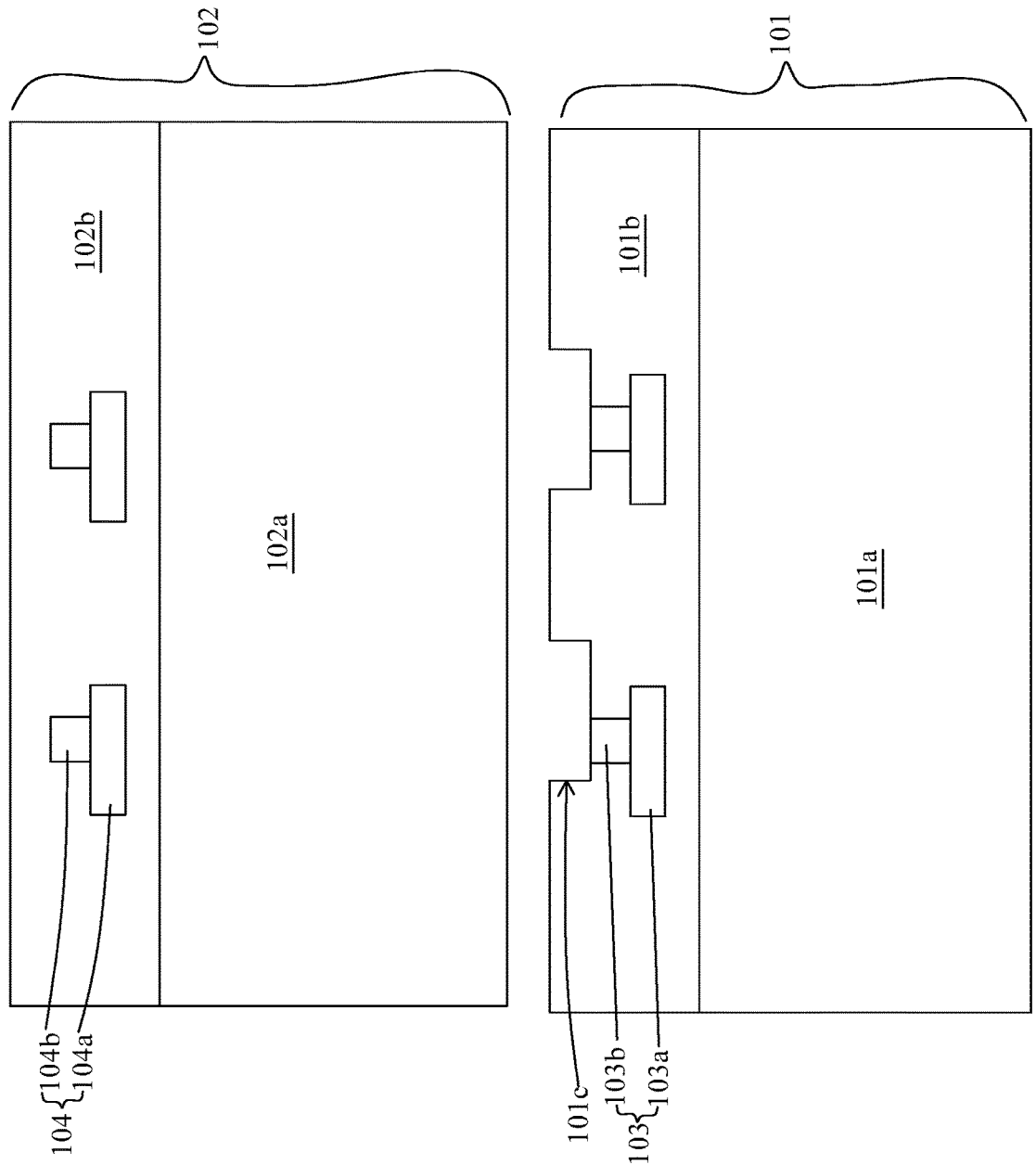

Referring to FIGS. 8 to 10, a first portion of the first dielectric layer 101b is removed to form a first recess 101c according to a step S503 in FIG. 5. In some embodiments, the first portion of the first dielectric layer 101b can be removed by photolithography, etching or any other suitable operation. In some embodiments, the first recess 101c is formed by disposing a first patterned photoresist 109 over the first dielectric layer 101b and removing the first portion of the first dielectric layer 101b exposed through the first patterned photoresist 109. In some embodiments, the first patterned photoresist 109 is formed by performing an exposure process and a develop process on a photoresist material. In some embodiments, the first patterned photoresist 109 is remove dafter the formation of the first recess 101c. In some embodiments, the first patterned photoresist 109 can be removed by stripping, etching or any other suitable operation.

In some embodiments, the first recess 101c exposes at least a portion of the first component 103. In some embodiments, a portion of the first conductive via 103b of the first component 103 is exposed by the first recess 101c. In some embodiments, a portion of the first component 103 is exposed through the first dielectric layer 101b. In some embodiments, the step S503 can be implemented prior to the step S502.

Figure 11:
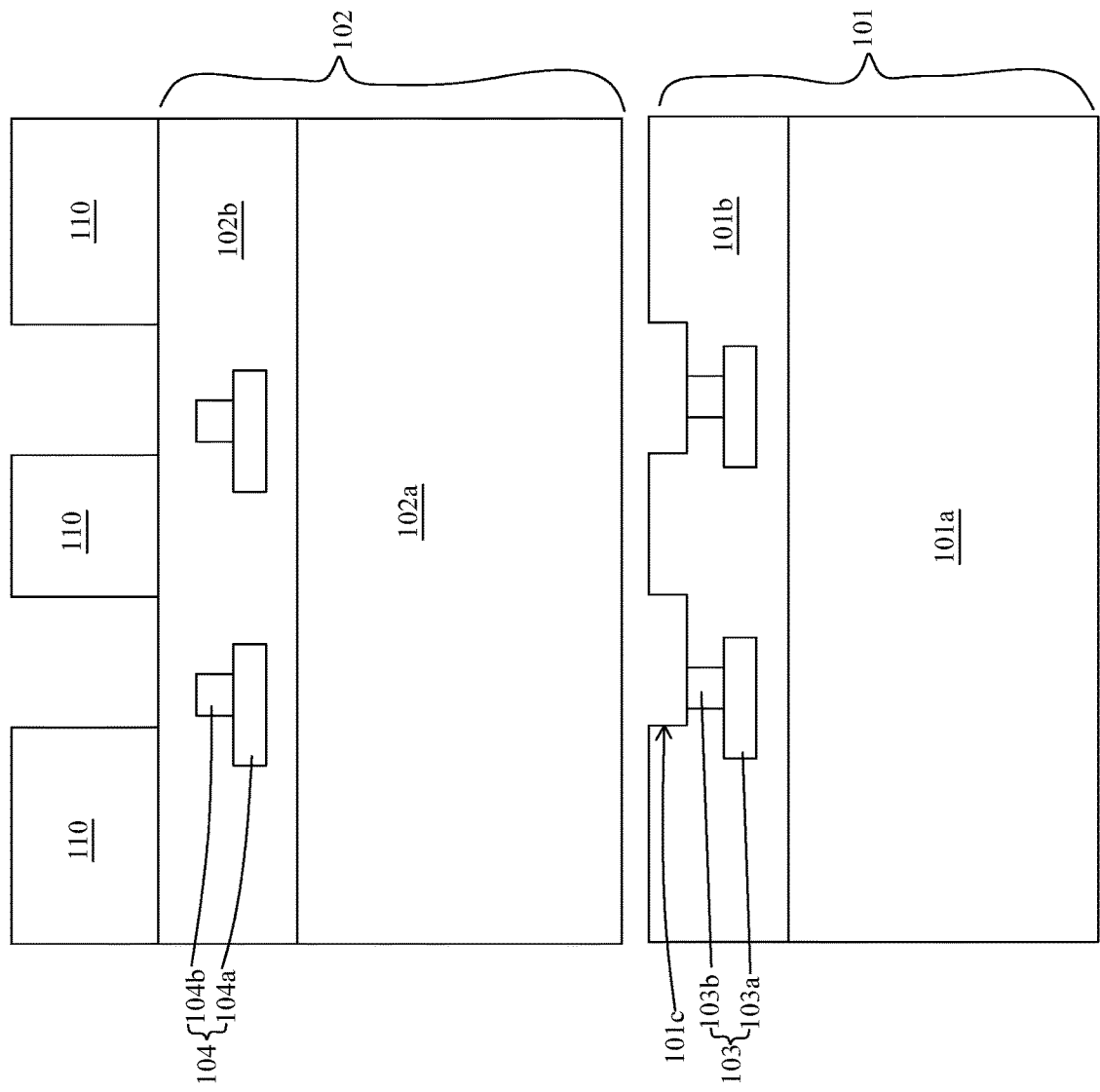
Figure 12:
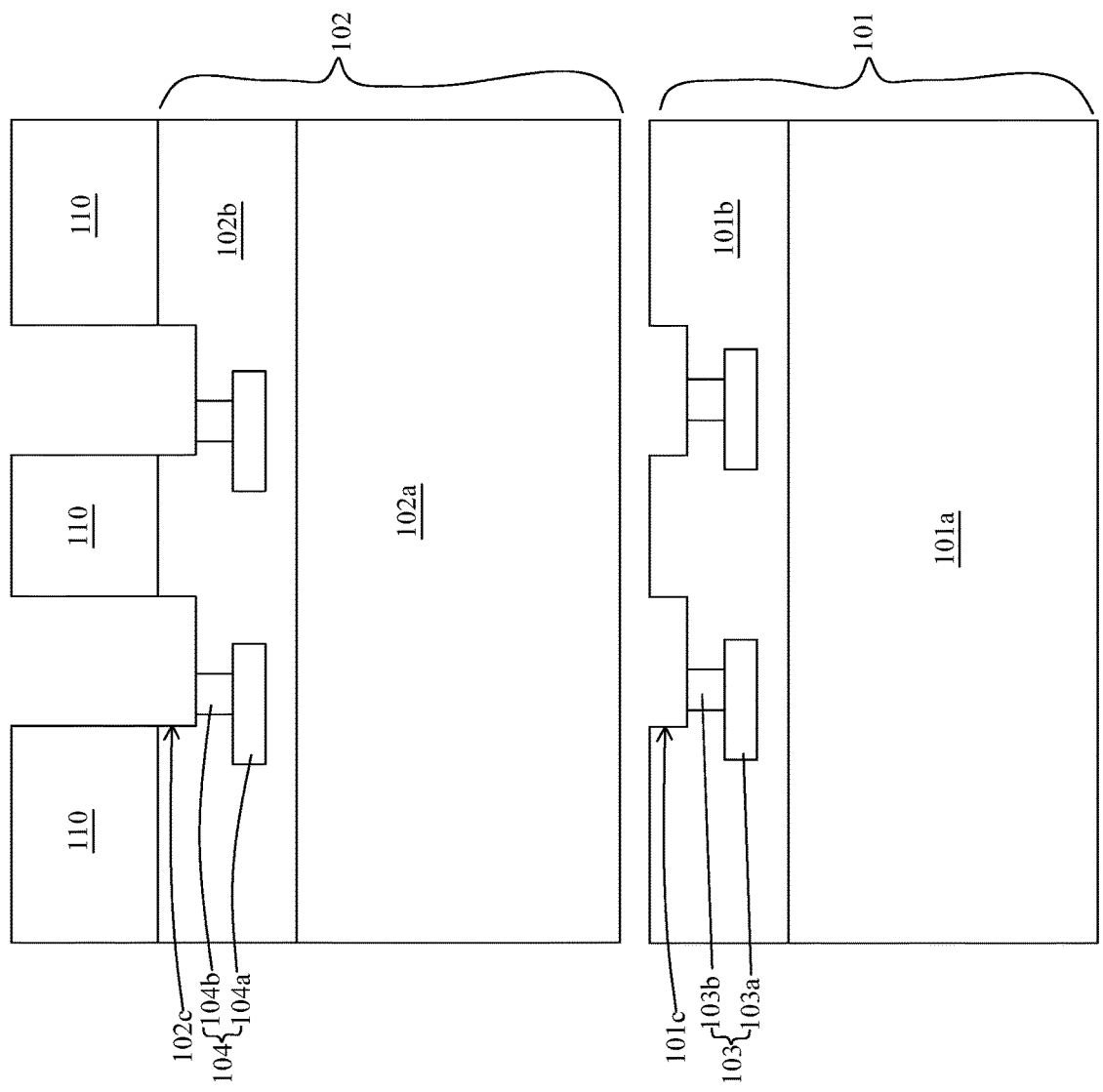
Figure 13:
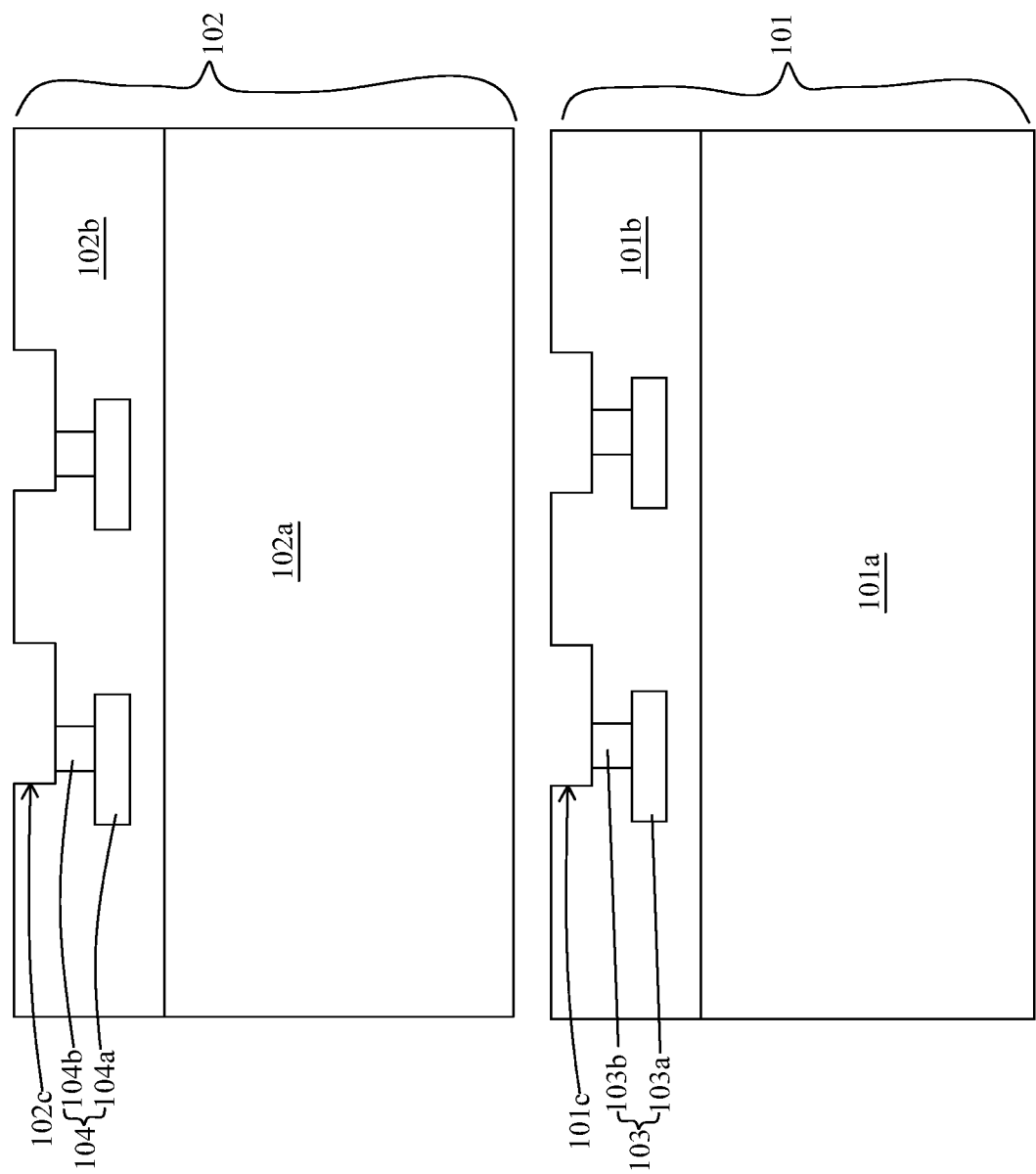

Referring to FIGS. 11 to 13, a second portion of the second dielectric layer 102b is removed to form a second recess 102c according to a step S504 in FIG. 5. In some embodiments, the second portion of the second dielectric layer 102b can be removed by photolithography, etching or any other suitable operation. In some embodiments, the second recess 102c is formed by disposing a second patterned photoresist 110 over the second dielectric layer 102b and removing the second portion of the second dielectric layer 102b exposed through the second patterned photoresist 110. In some embodiments, the second patterned photoresist 110 is formed by performing an exposure process and a develop process on a photoresist material. In some embodiments, the second patterned photoresist 110 is removed after the formation of the second recess 102c. In some embodiments, the second patterned photoresist 110 can be removed by stripping, etching or any other suitable operation.

In some embodiments, the second recess 102c exposes at least a portion of the second component 104. In some embodiments, a portion of the second conductive via 104b of the second component 104 is exposed by the second recess 102c. In some embodiments, a portion of the second component 104 is exposed through the second dielectric layer 102b. In some embodiments, the step S504 can be implemented after the step S502. In some embodiments, the step S504 can be implemented before or after the step S503. In some embodiments, the step S503 and the step S504 can be implemented separately or simultaneously.

Figure 14:
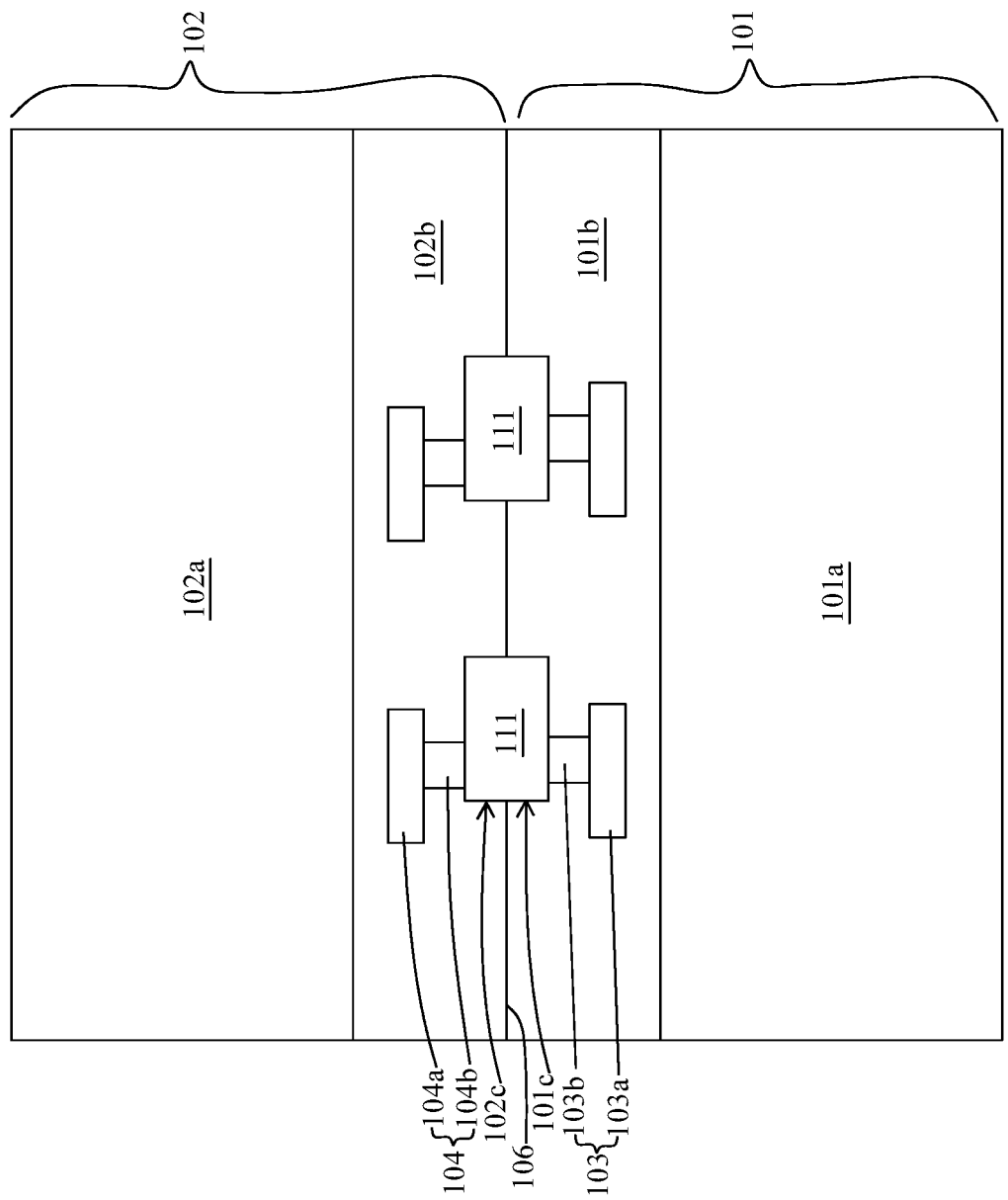

Referring to FIG. 14, the second wafer 102 is disposed over the first wafer 101 to bond the first dielectric layer 101b to the second dielectric layer 102b according to a step S505 in FIG. 5. In some embodiments, the second wafer 102 is flipped and then disposed over the first wafer 101. In some embodiments, the first dielectric layer 101b is in contact with the second dielectric layer 102b. In some embodiments, the second wafer 102 is bonded to the first wafer 101 by bonding the first dielectric layer 101b to the second dielectric layer 102b. In some embodiments, the first dielectric layer 101b is bonded to the second dielectric layer 102b by oxide fusion bonding, dielectric-to-dielectric bonding or any other suitable operation. In some embodiments, the step S505 is implemented after the step S503 and the step S504.

In some embodiments, a first interface 106 is formed between the first dielectric layer 101b and the second dielectric layer 102b. In some embodiments, the first dielectric layer 101b is bonded to the second dielectric layer 102b, so that the first recess 101c is aligned with the second recess 102c. In some embodiments, the second component 104 is disposed over the first component 103. In some embodiments, the second component 104 is aligned with the first component 103. In some embodiments, the first dielectric layer 101b is bonded to the second dielectric layer 102b, wherein the first recess 101c is offset from the second recess 102c in a manner similar to that of the first recess 101c and the second recess 102c in the third semiconductor structure 300 described above or illustrated in FIG. 3.

In some embodiments, a void 111 is formed after the bonding of the first dielectric layer 101b to the second dielectric layer 102b. In some embodiments, the void 111 is defined by the first recess 101c and the second recess 102c. In some embodiments, the void 111 is filled with air or gas.

Figure 15:
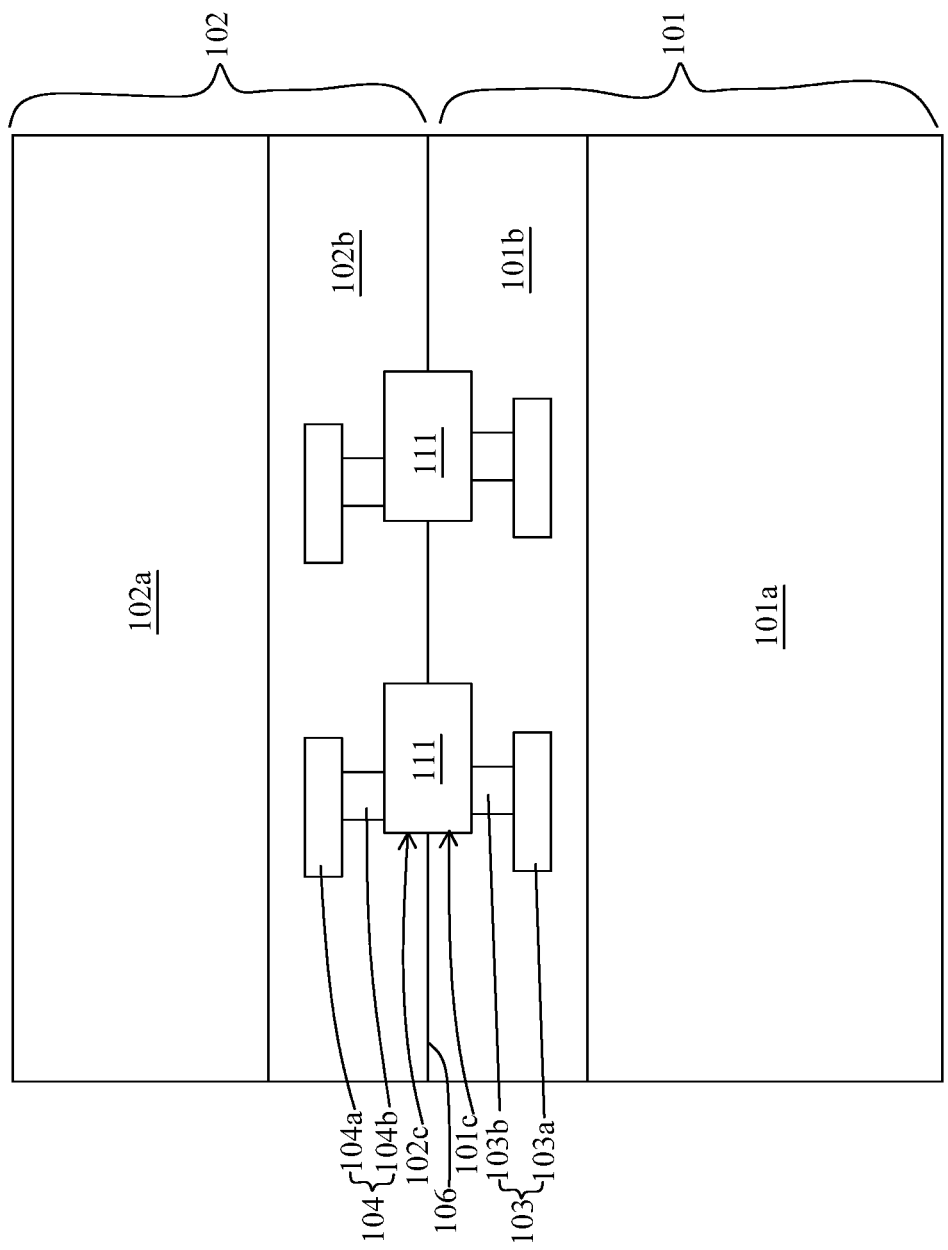

In some embodiments, referring to FIG. 15, a thickness of the second substrate 102a is reduced after the step S505. In some embodiments, the thickness of the second substrate 102a can be reduced by removing some of the second substrate 102a from a back side of the second substrate 102a farthest from the first wafer 101. In some embodiments, the reduction of the thickness of the second substrate 102a can be implemented by grinding, etching, chemical mechanical polishing (CMP) or any other suitable operation. In some embodiments, the back side of the second substrate 102a is ground in order to reduce a thickness of the second substrate 102a and an overall thickness of the second wafer 102.

Figure 16:
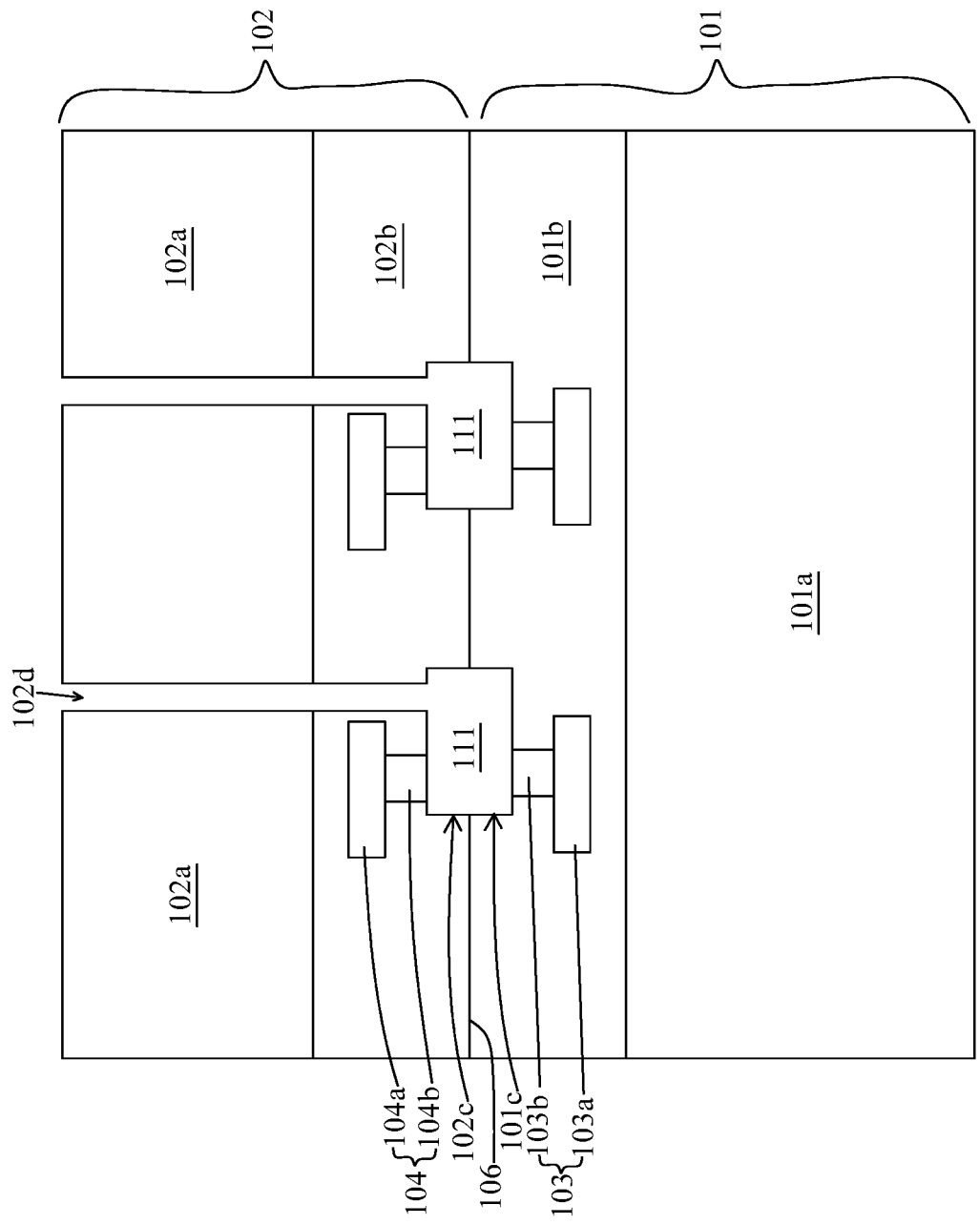

Referring to FIG. 16, a third portion of the second substrate 102a and the second dielectric layer 102b is removed to form a third recess 102d according to a step S506 in FIG. 5. In some embodiments, the thickness of the second substrate 102a is reduced prior to the step S506. In some embodiments, the third portion of the second substrate 102a and the second dielectric layer 102b can be removed by etching, deep reactive ion etching (DRIE), isotropic etching, laser drilling or any other suitable operation. In some embodiments, the third recess 102d is formed by one or more iterations of etching processes. For example, the third recess 102d is formed by removing a portion of the second substrate 102a, and then removing a portion of the second dielectric layer 102b. In some embodiments, the third recess 102d is coupled to the second recess 102c. In some embodiments, the void 111 is accessible through the third recess 102d.

Figure 17:
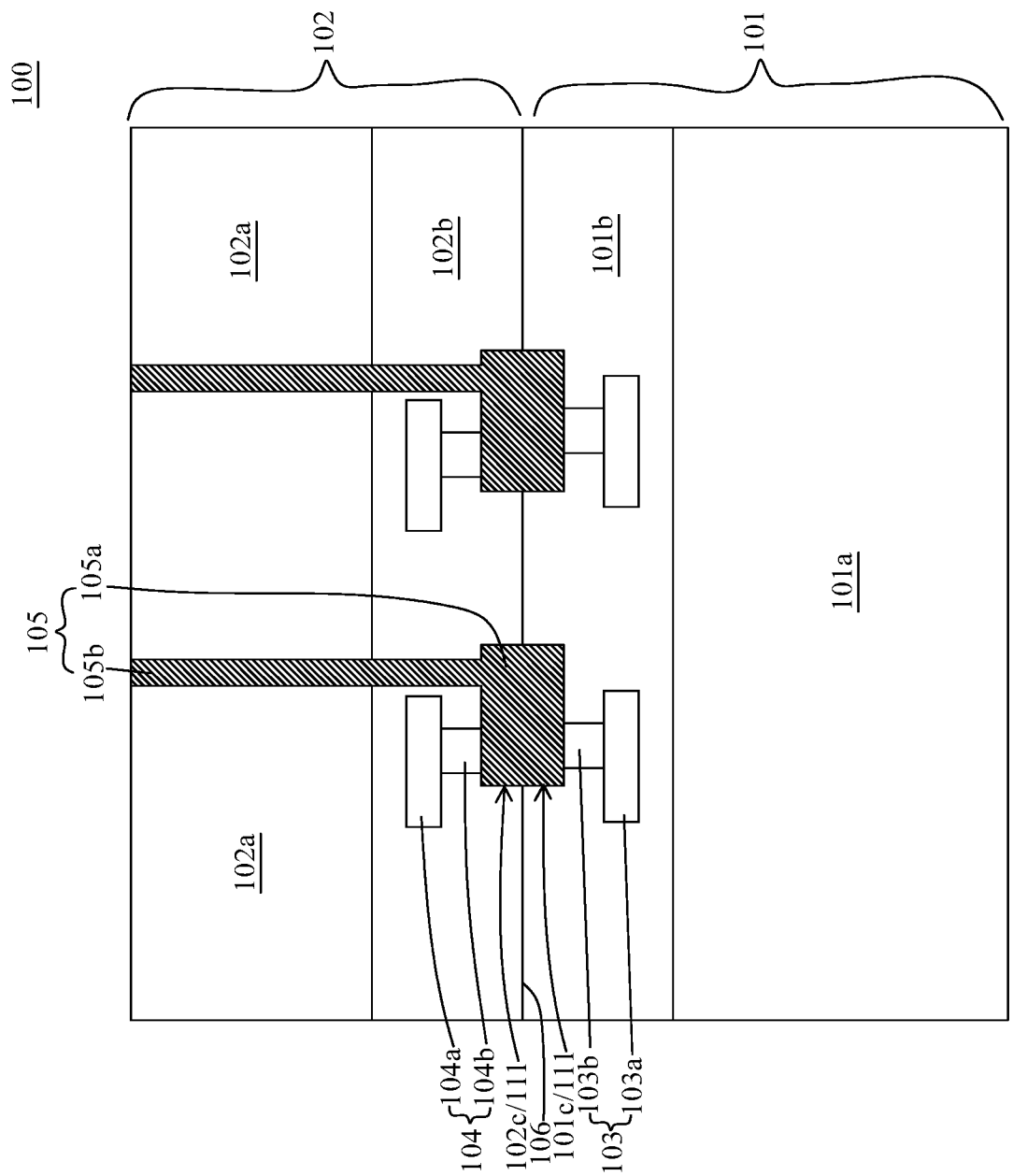

Referring to FIG. 17, a conductive material is disposed to fill the first recess 101c, the second recess 102c and the third recess 102d and form a conductive structure 105 according to a step S507 in FIG. 5. In some embodiments, the conductive material is disposed by electroplating or any other suitable operation. In some embodiments, the conductive material includes copper or any other suitable material. In some embodiments, the conductive structure 105 is formed by filling the void 111 with the conductive material, and then filling the third recess 102d with the conductive material. In some embodiments, the first recess 101c and the second recess 102c are filled with the conductive material after the first dielectric layer 101b is bonded to the second dielectric layer 102b (the step S505).

In some embodiments, the conductive structure 105 including a first member 105a and a second member 105b is formed. In some embodiments, the first member 105a is surrounded by the first dielectric layer 101b and the second dielectric layer 102b. In some embodiments, the second member 105b is surrounded by the second wafer 102. In some embodiments, the conductive structure 105 is electrically connected to the first component 103 and the second component 104 after the disposing of the conductive material. In some embodiments, the first semiconductor structure 100 as shown in FIG. 1 is formed.

Figure 18:
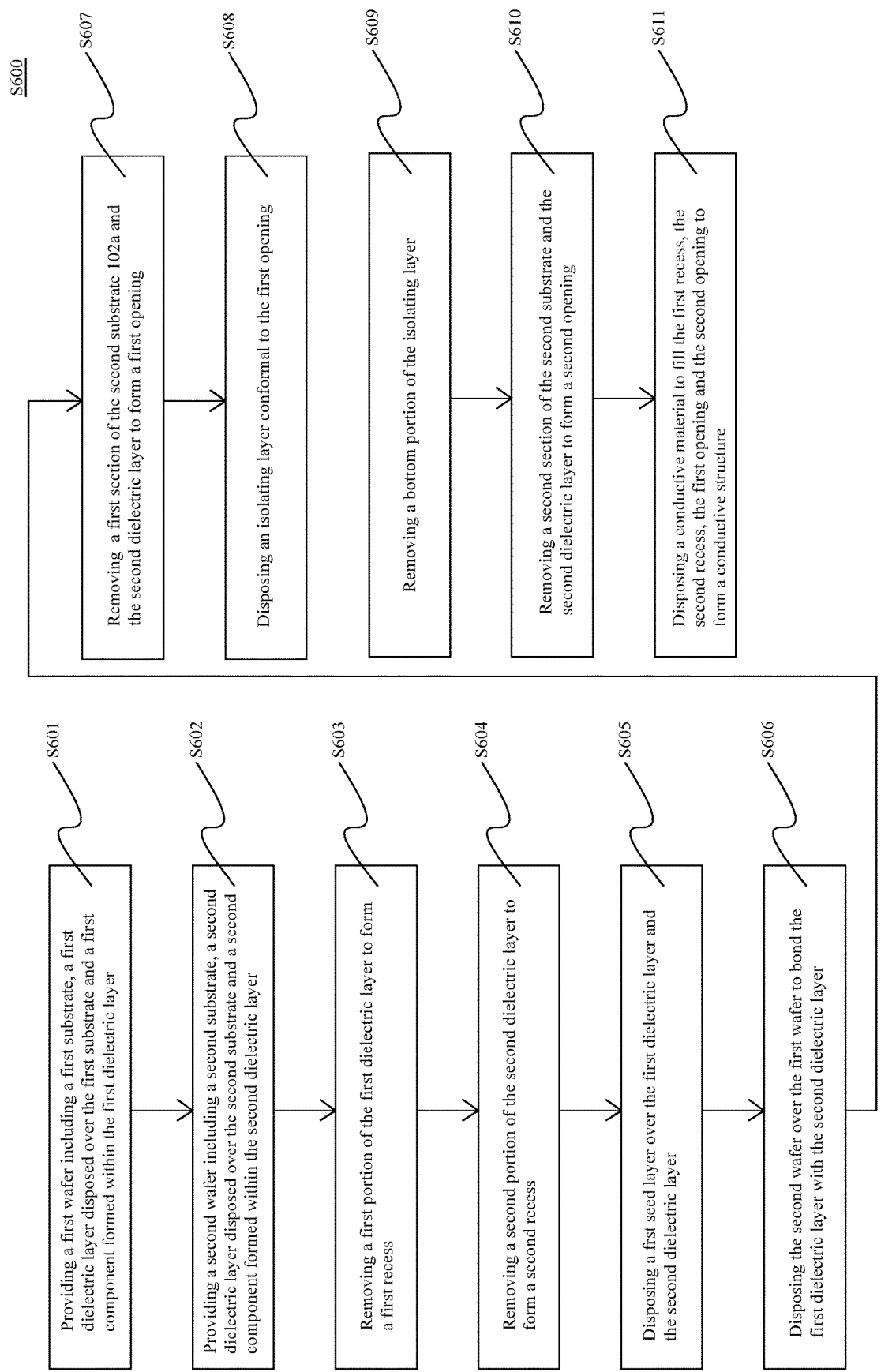
FIG. 18 is a flow diagram illustrating a method of manufacturing a semiconductor structure in accordance with some embodiments of the present disclosure.

FIG. 18 is a flow diagram illustrating a second method S600 of manufacturing a second semiconductor structure 200 in accordance with some embodiments of the present disclosure, and FIGS. 1 to 13 and 19 to 27 illustrate cross-sectional views of intermediate stages in the formation of the second semiconductor structure 200 in accordance with some embodiments of the present disclosure. The stages shown in FIGS. 1 to 13 and 19 to 27 are also illustrated schematically in the flow diagram in FIG. 18. In the following discussion, the fabrication stages shown in FIGS. 1 to 13 and 19 to 27 are discussed in reference to the process steps shown in FIG. 18. The second method S600 includes a number of operations and the description and illustration are not deemed as a limitation as the sequence of the operations. The second method S600 includes a number of steps (S601, S602, S603, S604, S605, S606, S607, S608, S609, S610 and S611).

Steps S601 to S604 are same as the steps S501 to S504 described above or illustrated by FIGS. 1 to 13, and repeated description of such steps is omitted for brevity.

Figure 19:
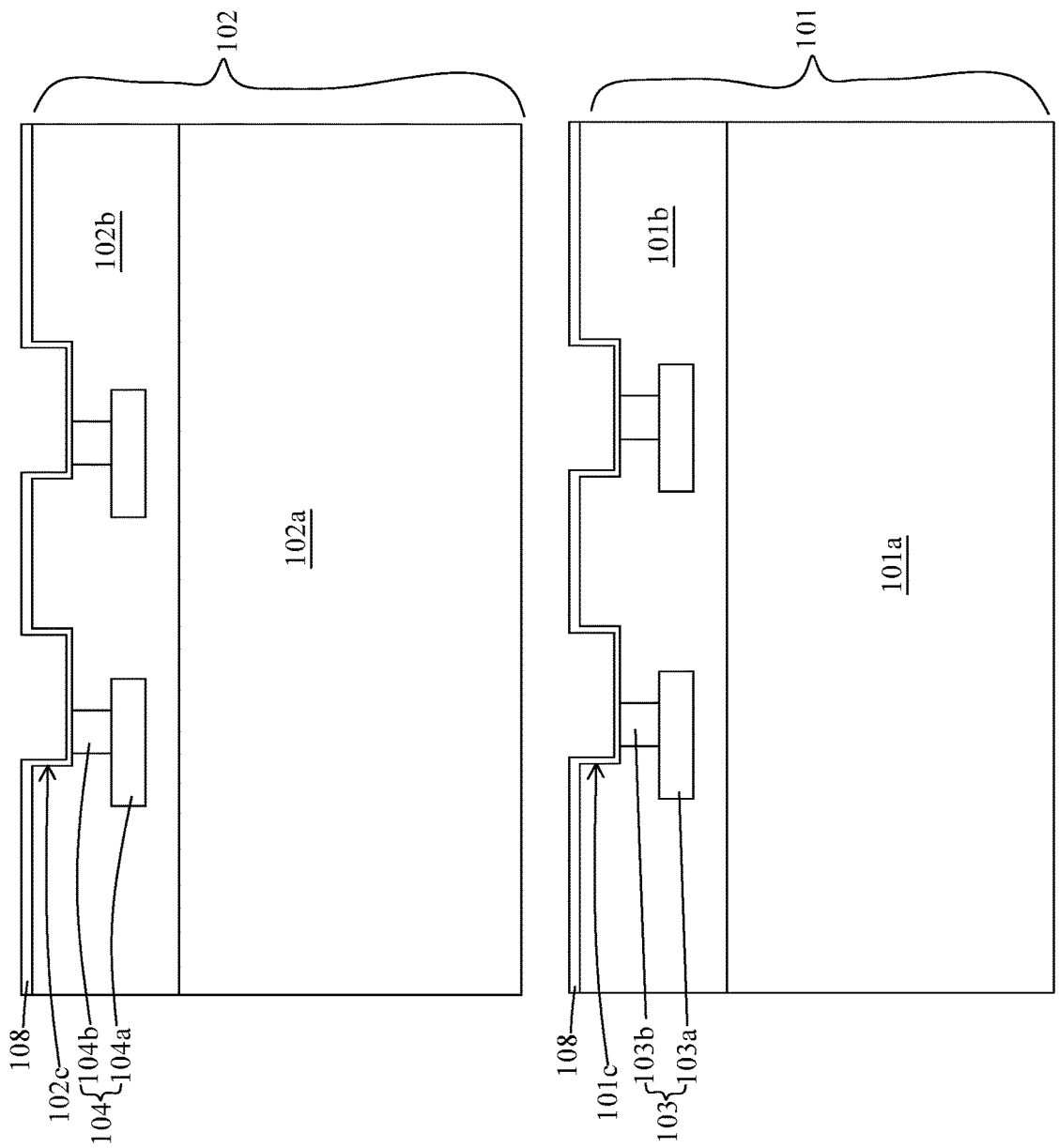
FIGS. 19 through 27 illustrate cross-sectional views of intermediate stages in the formation of a semiconductor structure in accordance with some embodiments of the present disclosure.
Figure 20:
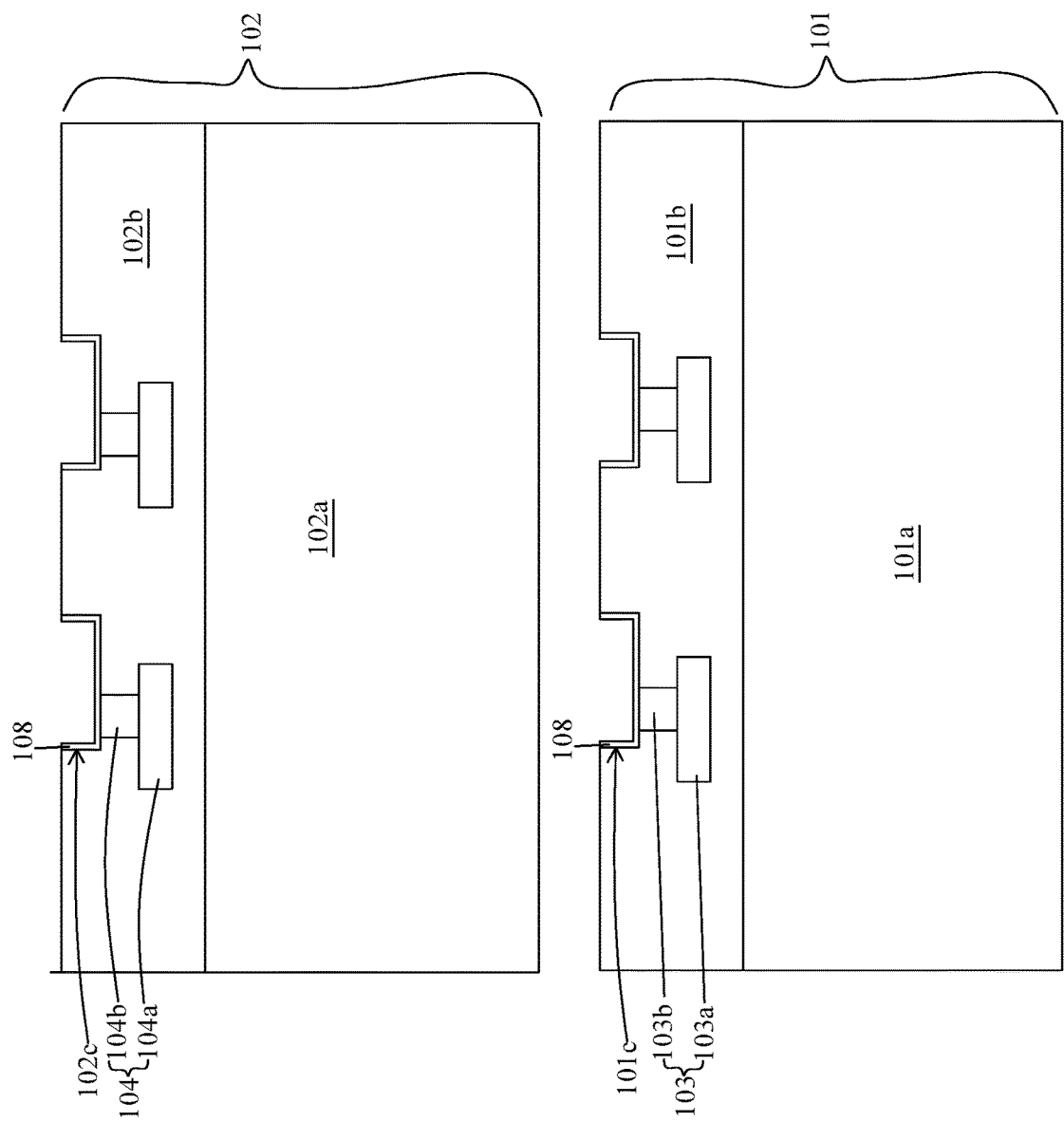

Referring to FIGS. 19 to 20, a first seed layer 108 is disposed over the first dielectric layer 101b and the second dielectric layer 102b respectively according to a step S605 in FIG. 18. In some embodiments, the first seed layer 108 is conformal to the first recess 101c and the second recess 102c.

In some embodiments, the first seed layer 108 is disposed by deposition, physical vapor deposition (PVD) or any other suitable operation. In some embodiments, the first seed layer 108 includes titanium and copper. In some embodiments, portions of the first seed layer 108 disposed on the first dielectric layer 101b and the second dielectric layer 102b and outside of the first recess 101c and the second recess 102c are removed.

Figure 21:
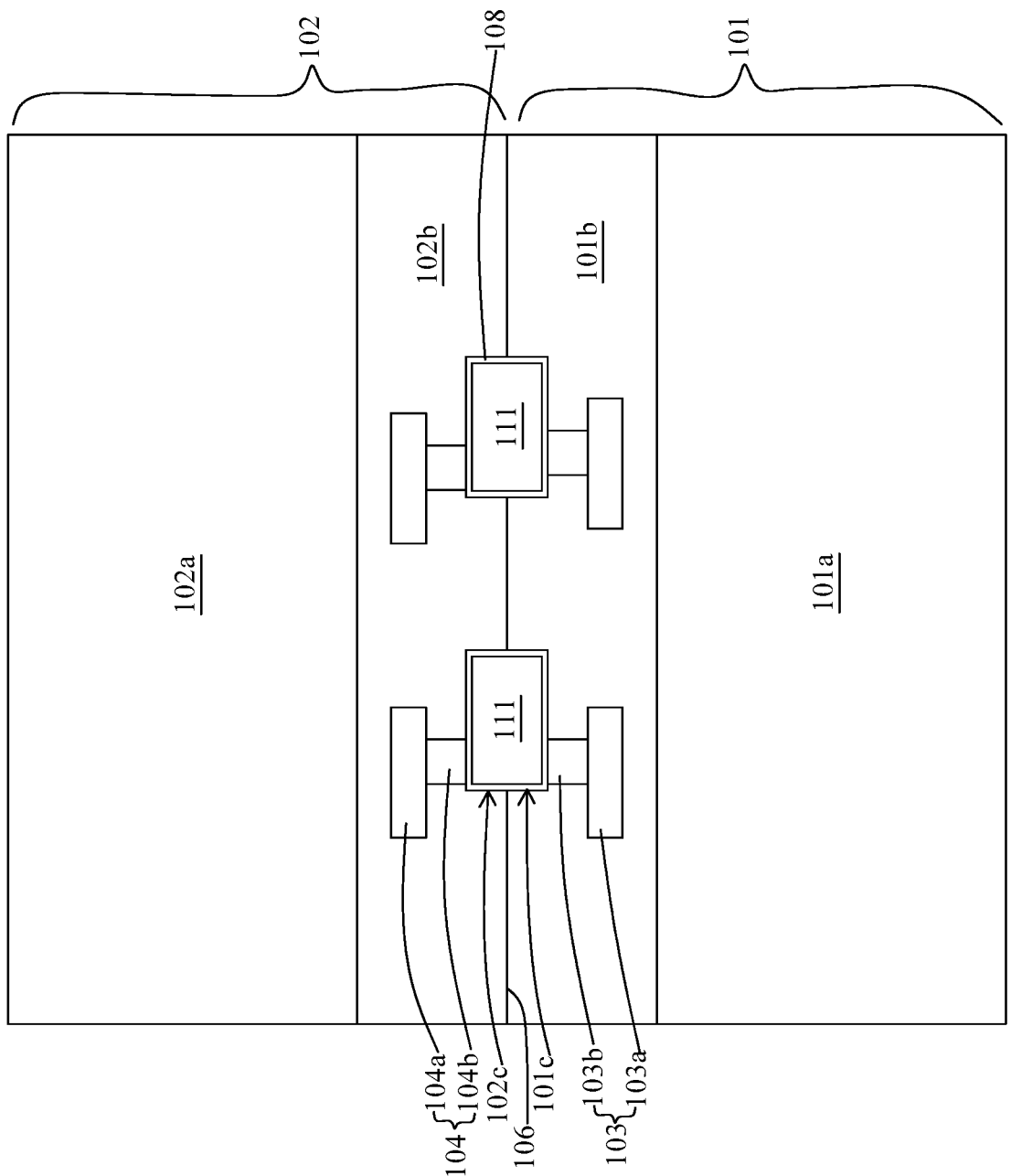
Figure 22:
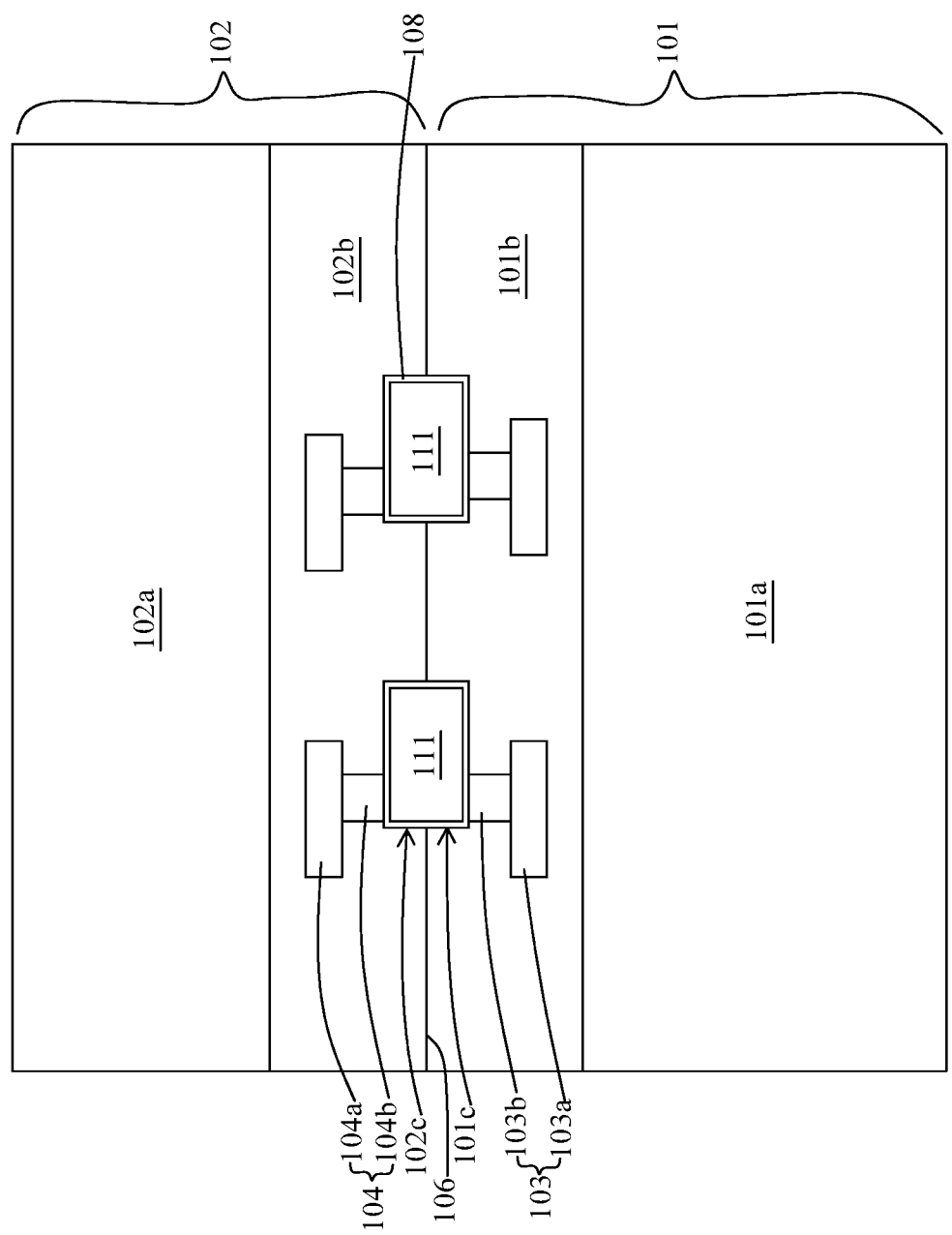

Referring to FIG. 21, the second wafer 102 is disposed over the first wafer 101 to bond the first dielectric layer 101b to the second dielectric layer 102b according to a step S606 in FIG. 18. The step S606 is same as the step S505 described above or illustrated in FIG. 14. In some embodiments, referring to FIG. 22, a thickness of the second substrate 102a is reduced after the step S606, similar to the step described above or illustrated in FIG. 15.

Figure 23:
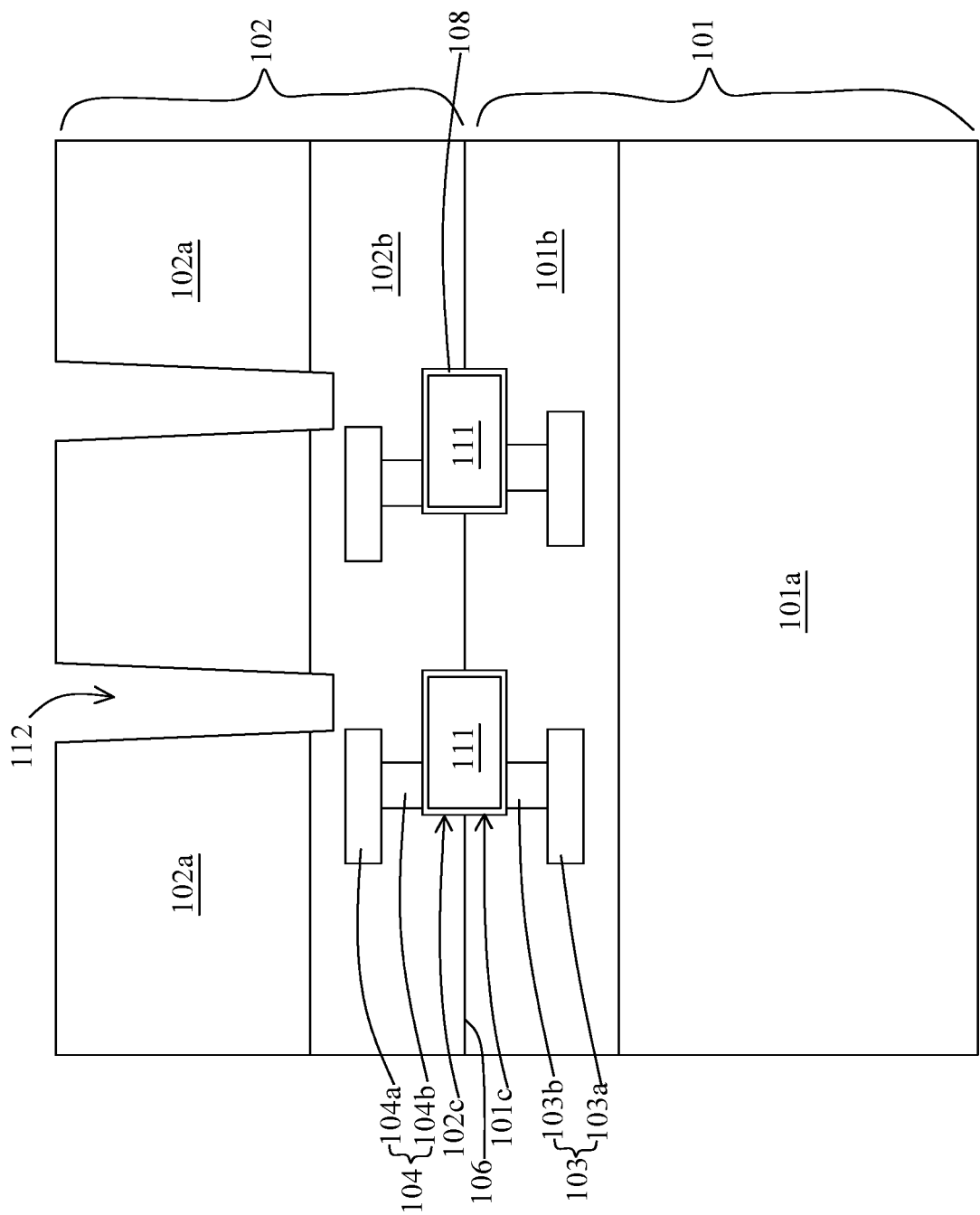

Referring to FIG. 23, a first section of the second substrate 102a and the second dielectric layer 102b is removed to form a first opening 112 according to a step S607 in FIG. 18. In some embodiments, the first section of the second substrate 102a and the second dielectric layer 102b can be removed by etching, deep reactive ion etching (DRIE), isotropic etching, laser drilling or any other suitable operation. In some embodiments, the first opening 112 extends through the second substrate 102a and partially through the second dielectric layer 102b.

Figure 24:
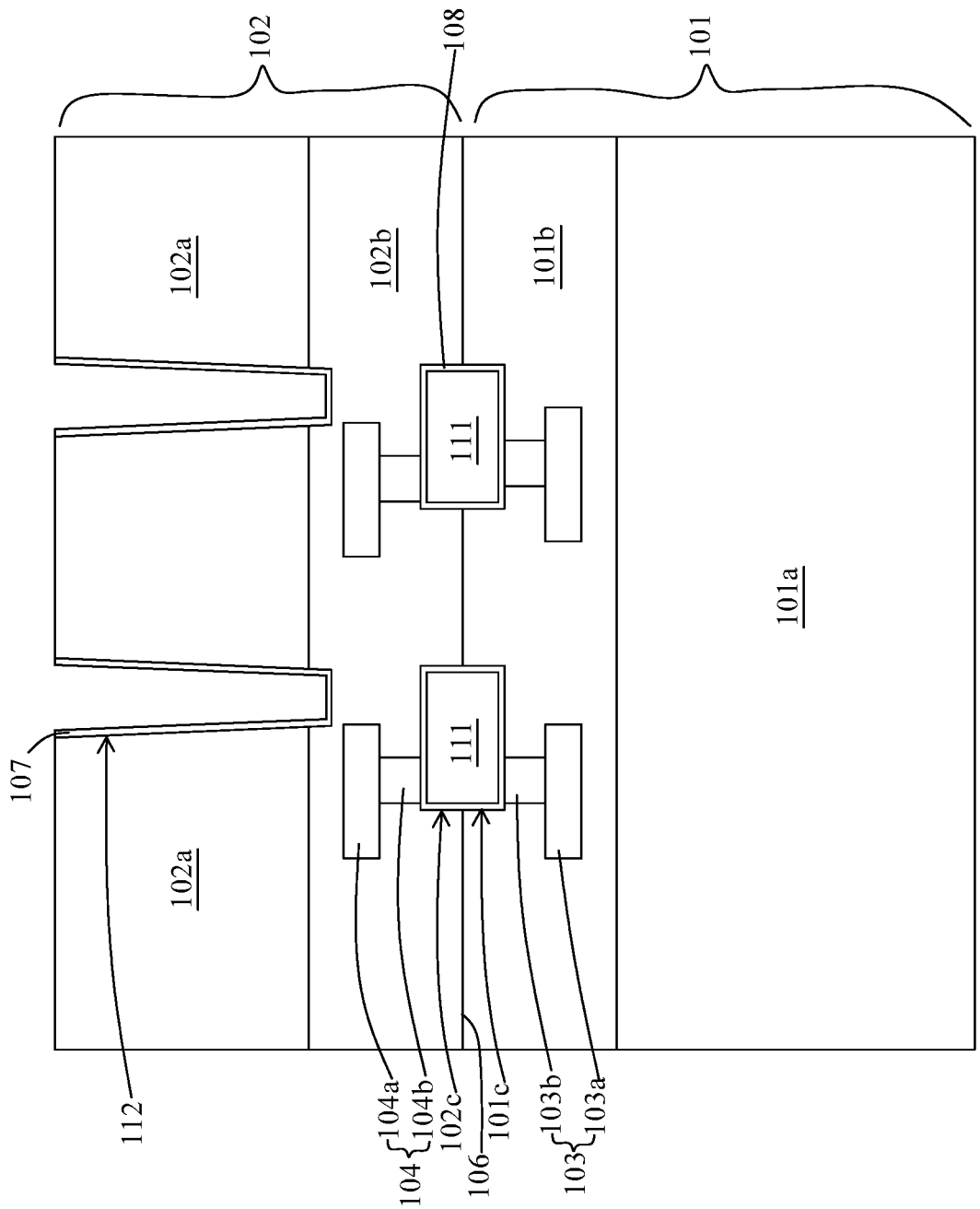

Referring to FIG. 24, an isolating layer 107 is disposed conformal to the first opening 112 according to a step S608 in FIG. 18. In some embodiments, the isolating layer 107 is disposed by atomic layer deposition (ALD), sputtering or any other suitable operation. In some embodiments, the isolating layer 107 is disposed along sidewalls of the first opening 112. In some embodiments, the isolating layer 107 includes oxide or any other suitable material.

Figure 25:
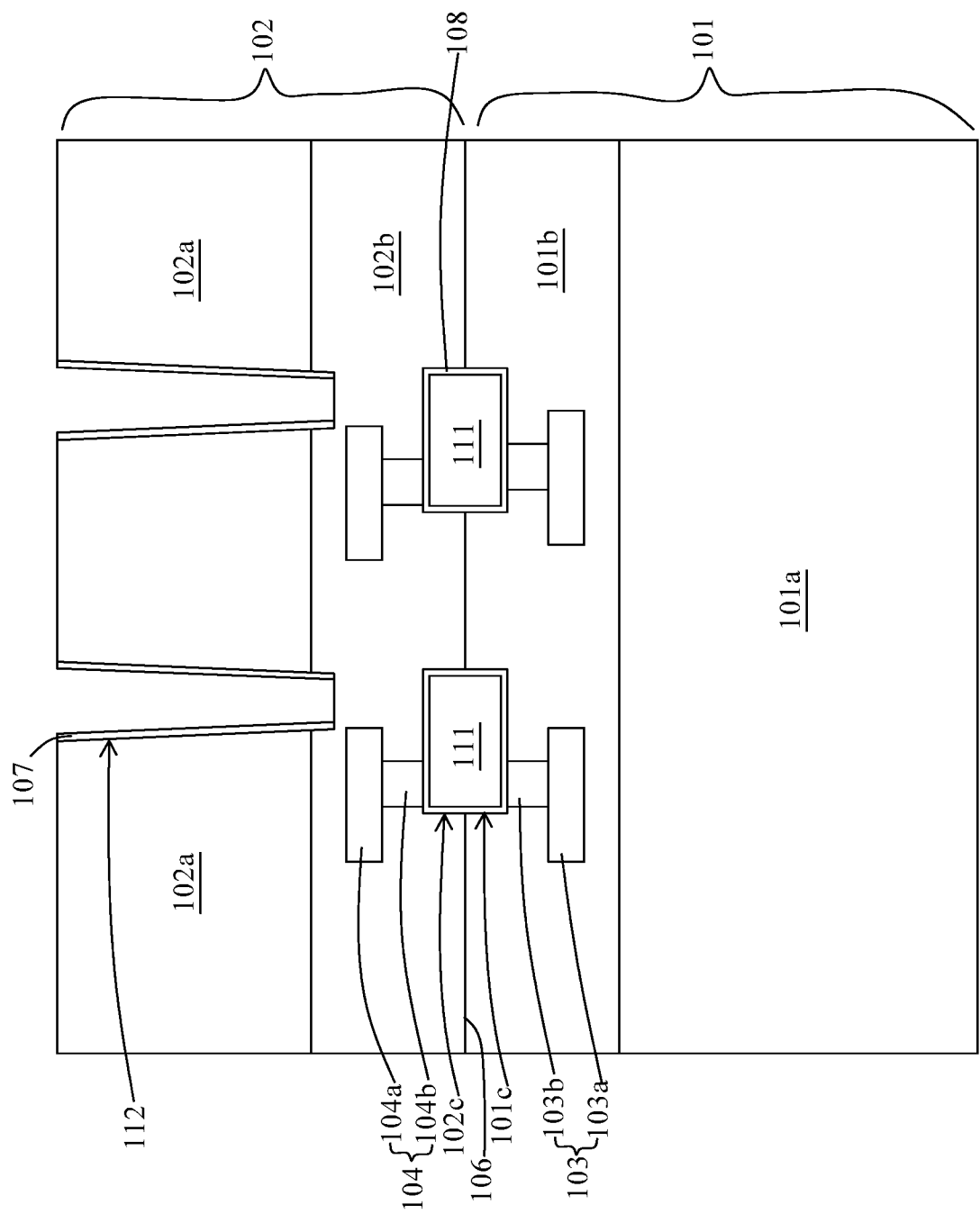

Referring to FIG. 25, a bottom portion of the isolating layer 107 is removed according to a step S609 in FIG. 18. In some embodiments, the bottom portion of the isolating layer 107 can be removed by etching or any other suitable operation. In some embodiments, a thickness of the second dielectric layer 102b between a bottom of the first opening 112 and the void 111 is about 1 µm. In some embodiments, a thickness of the second dielectric layer 102b between the bottom of the first opening 112 and the first seed layer 108 is about 1 µm.

Figure 26:
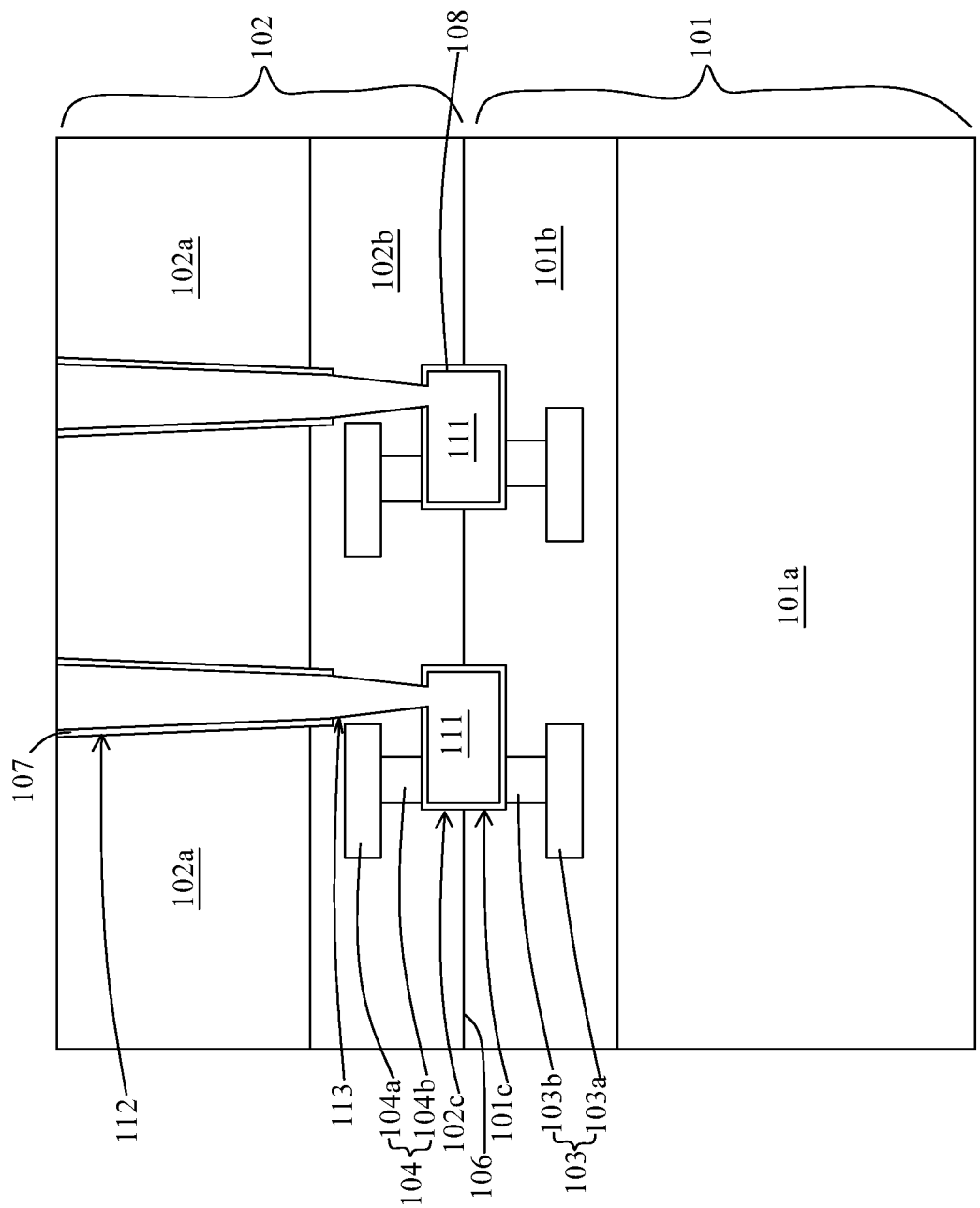

Referring to FIG. 26, a second section of the second substrate 102a and the second dielectric layer 102b is removed to form a second opening 113 according to a step S610 in FIG. 18. In some embodiments, the second section of the second substrate 102a and the second dielectric layer 102b can be removed by etching, deep reactive ion etching (DRIE), isotropic etching, laser drilling or any other suitable operation. In some embodiments, the second substrate 102a serves as a hard mask during the removal of the second section. In some embodiments, the second section is removed, such that the first opening 112 is coupled to the void 111 through the second opening 113. The void 111 is now accessible through the first opening 112 and the second opening 113. In some embodiments, the second opening 113 is surrounded by the second dielectric layer 102b only. In some embodiments, the step S609 and the step S610 are implemented separately or simultaneously. In some embodiments, the step S609 is performed prior to the step S610.

Figure 27:
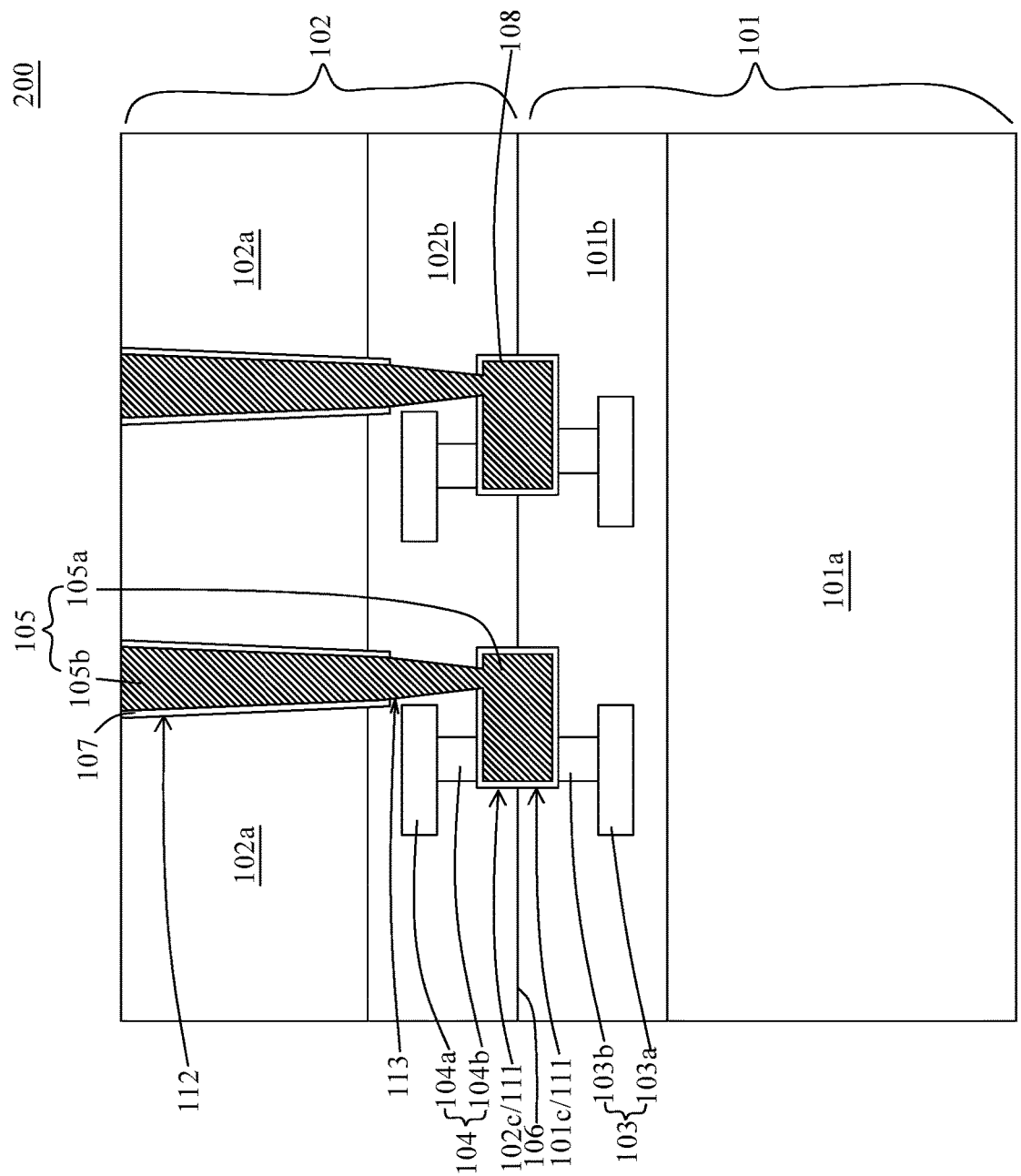

Referring to FIG. 27, a conductive material is disposed to fill the first recess 101c, the second recess 102c, the first opening 112 and the second opening 113 and form a conductive structure 105 according to a step S611 in FIG. 18. In some embodiments, a second seed layer is disposed conformal to the first recess 101c, the second recess 102c, the first opening 112 and the second opening 113 prior to the disposing of the conductive material. In some embodiments, the second seed layer is disposed by PVD, sputtering or any other suitable operation. In some embodiments, the second seed layer includes titanium and copper.

In some embodiments, the conductive material is disposed by electroplating or any other suitable operation. In some embodiments, the conductive material includes copper or any other suitable material. In some embodiments, the conductive structure 105 is formed by filling the void 111 with the conductive material, and then filling the first opening 112 and the second opening 113 with the conductive material. In some embodiments, the conductive structure 105 includes a first member 105a and a second member 105b.

In some embodiments, the first member 105a is surrounded by the first dielectric layer 101b and the second dielectric layer 102b. In some embodiments, the second member 105b is surrounded by the second wafer 102. In some embodiments, the conductive structure 105 is electrically connected to the first component 103 and the second component 104 after the disposing of the conductive material. In some embodiments, the second semiconductor structure is formed as shown in FIG. 2.

In some embodiments, if the first recess 101c is offset from the second recess 102c, the third semiconductor structure shown in FIG. 3 is formed after the disposing of the conductive material. In some embodiments, a second interface between the conductive structure 105 and the first dielectric layer 101b is formed after the disposing of the conductive material. In some embodiments, a third interface between the conductive structure 105 and the second dielectric layer 102b is formed after the disposing of the conductive material.

In conclusion, the semiconductor structure 100, 200, 300 or 400 including a void 111 between the first wafer 101 and the second wafer 102 and a conductive structure 105 within the void 111 is formed. Since the conductive structure 105 is formed after bonding of the first wafer 101 and the second wafer 102, alignment between the first wafer 101 and the second wafer 102 would not adversely affect formation of the conductive structure 105. Therefore, reliability of the conductive structure 105 and overall performance of the semiconductor structure 100, 200, 300 or 400 having such conductive structure 105 can be improved.

One aspect of the present disclosure provides a semiconductor structure. The semiconductor structure comprises a first wafer including a first dielectric layer and a first component disposed within the first dielectric layer; a second wafer disposed over the first wafer and including a second dielectric layer over the first dielectric layer, and a second component within the second dielectric layer; and a conductive structure including a first member surrounded by the first dielectric layer and the second dielectric layer, and a second member protruding from the first member and surrounded by the second wafer.

One aspect of the present disclosure provides a method of manufacturing a semiconductor structure. The method includes steps of providing a first wafer including a first substrate, a first dielectric layer disposed over the first substrate, and a first component formed within the first dielectric layer; providing a second wafer including a second substrate, a second dielectric layer disposed over the second substrate, and a second component formed within the second dielectric layer; removing a first portion of the first dielectric layer to form a first recess; removing a second portion of the second dielectric layer to form a second recess; disposing the second wafer over the first wafer to bond the first dielectric layer to the second dielectric layer; removing a third portion of the second substrate and the second dielectric layer to form a third recess coupled to the second recess; and disposing a conductive material to fill the first recess, the second recess and the third recess to form a conductive structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:
   providing a first wafer including a first substrate, a first dielectric layer disposed over the first substrate, and a first component formed within the first dielectric layer;
   providing a second wafer including a second substrate, a second dielectric layer disposed over the second substrate, and a second component formed within the second dielectric layer;
   removing a first portion of the first dielectric layer to form a first recess;
   removing a second portion of the second dielectric layer to form a second recess;
   disposing the second wafer over the first wafer to bond the first dielectric layer to the second dielectric layer;
   removing a third portion of the second substrate and the second dielectric layer to form a third recess coupled to the second recess; and
   disposing a conductive material to fill the first recess, the second recess and the third recess to form a conductive structure.

2. The method of claim 1, wherein the removal of the first portion of the first dielectric layer includes exposing a portion of the first component through the first dielectric layer.

3. The method of claim 2, wherein the removal of the second portion of the second dielectric layer includes exposing a portion of the second component through the second dielectric layer.

4. The method of claim 1, wherein the first recess is aligned with the second recess.

5. The method of claim 1, wherein a void defined by the first recess and the second recess is formed after the disposing of the second wafer over the first wafer.

6. The method of claim 1, wherein the removal of the third portion of the second substrate and the second dielectric layer includes removing a first section of the third portion to form a first opening, disposing an isolating layer conformal to the first opening, removing a bottom portion of the isolating layer, and removing a second section of the third portion to form a second opening.

7. The method of claim 1, wherein the conductive material is disposed by electroplating.

8. The method of claim 1, wherein the third portion of the second substrate and the second dielectric layer is removed by dry etching or laser drilling.

9. The method of claim 1, wherein the disposing of the second wafer over the first wafer includes forming a first interface between the first dielectric layer and the second dielectric layer.

10. The method of claim 1, wherein a second interface between the conductive structure and the first dielectric layer or a third interface between the conductive structure and the second dielectric layer is formed after the disposing of the conductive material.

11. The method of claim 1, further comprising grinding the second substrate to reduce a thickness of the second wafer prior to the removal of the third portion of the second substrate and the second dielectric layer.

12. The method of claim 1, wherein the first recess and the second recess are filled with the conductive material after the first dielectric layer is bonded to the second dielectric layer.

\* \* \* \* \*